(12) United States Patent
Sashida

(10) Patent No.: US 8,216,857 B2
(45) Date of Patent: Jul. 10, 2012

(54) FERROELECTRIC MEMORY DEVICE AND FABRICATION PROCESS THEREOF, FABRICATION PROCESS OF A SEMICONDUCTOR DEVICE

(75) Inventor: Naoya Sashida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/502,518

(22) Filed: Jul. 14, 2009

(65) Prior Publication Data

US 2009/0280578 A1    Nov. 12, 2009

Related U.S. Application Data

(62) Division of application No. 11/315,212, filed on Dec. 23, 2005, now Pat. No. 7,579,641.

(30) Foreign Application Priority Data

Sep. 1, 2005    (JP) .................................. 2005-253909

(51) Int. Cl.
*H01L 21/8246*    (2006.01)
(52) U.S. Cl. ............. 438/3; 257/E21.208; 257/E21.664; 257/E27.104
(58) Field of Classification Search .................. 257/295, 257/E27.104, E21.663, E21.664, E21.208; 438/3
See application file for complete search history.

(56) References Cited

U.S. PATENT DOCUMENTS

| | | | |
|---|---|---|---|
| 5,341,325 A | 8/1994 | Nakano et al. | |
| 6,992,019 B2 | 1/2006 | Lee et al. | |
| 7,084,076 B2 | 8/2006 | Park et al. | |
| 7,504,684 B2 | 3/2009 | Kanaya | |
| 2004/0166596 A1 | 8/2004 | Sashida et al. | |
| 2004/0180557 A1* | 9/2004 | Park et al. ..................... | 438/787 |
| 2005/0205910 A1 | 9/2005 | Kumura et al. | |
| 2006/0040510 A1 | 2/2006 | Lee et al. | |
| 2008/0073680 A1 | 3/2008 | Wang | |
| 2008/0142915 A1 | 6/2008 | Sashida | |
| 2008/0191254 A1 | 8/2008 | Matsuura | |

FOREIGN PATENT DOCUMENTS

| | | |
|---|---|---|
| CN | 1480998 A | 3/2004 |
| JP | 2004-153031 A | 5/2004 |

OTHER PUBLICATIONS

Chinese Office Action dated Mar. 28, 2008, issued in corresponding Chinese Patent Application No. 200610006717.4.
Chinese Office Action dated Mar. 28, 2008, issued in corresponding Chinese Patent Application No. 200610006417.4.

* cited by examiner

*Primary Examiner* — Anh Phung
*Assistant Examiner* — Michael Lulis
(74) *Attorney, Agent, or Firm* — Westerman, Hattori, Daniels & Adrian, LLP

(57) ABSTRACT

A ferroelectric memory device includes a field effect transistor formed on a semiconductor substrate, an interlayer insulation film formed on the semiconductor substrate so as to cover the field effect transistor, a conductive plug formed in the interlayer insulation film in contact with the first diffusion region, and a ferroelectric capacitor formed over the interlayer insulation in contact with the conductive plug, wherein the ferroelectric capacitor includes a ferroelectric film and upper and lower electrodes sandwiching the ferroelectric film respectively from above and below, the lower electrode being connected electrically to the conductive plug, a layer containing oxygen being interposed between the conductive plug and the lower electrode, a layer containing nitrogen being interposed between the layer containing oxygen and the lower electrode, a self-aligned layer being interposed between the layer containing nitrogen and the lower electrode.

11 Claims, 28 Drawing Sheets

Related Art

Related Art

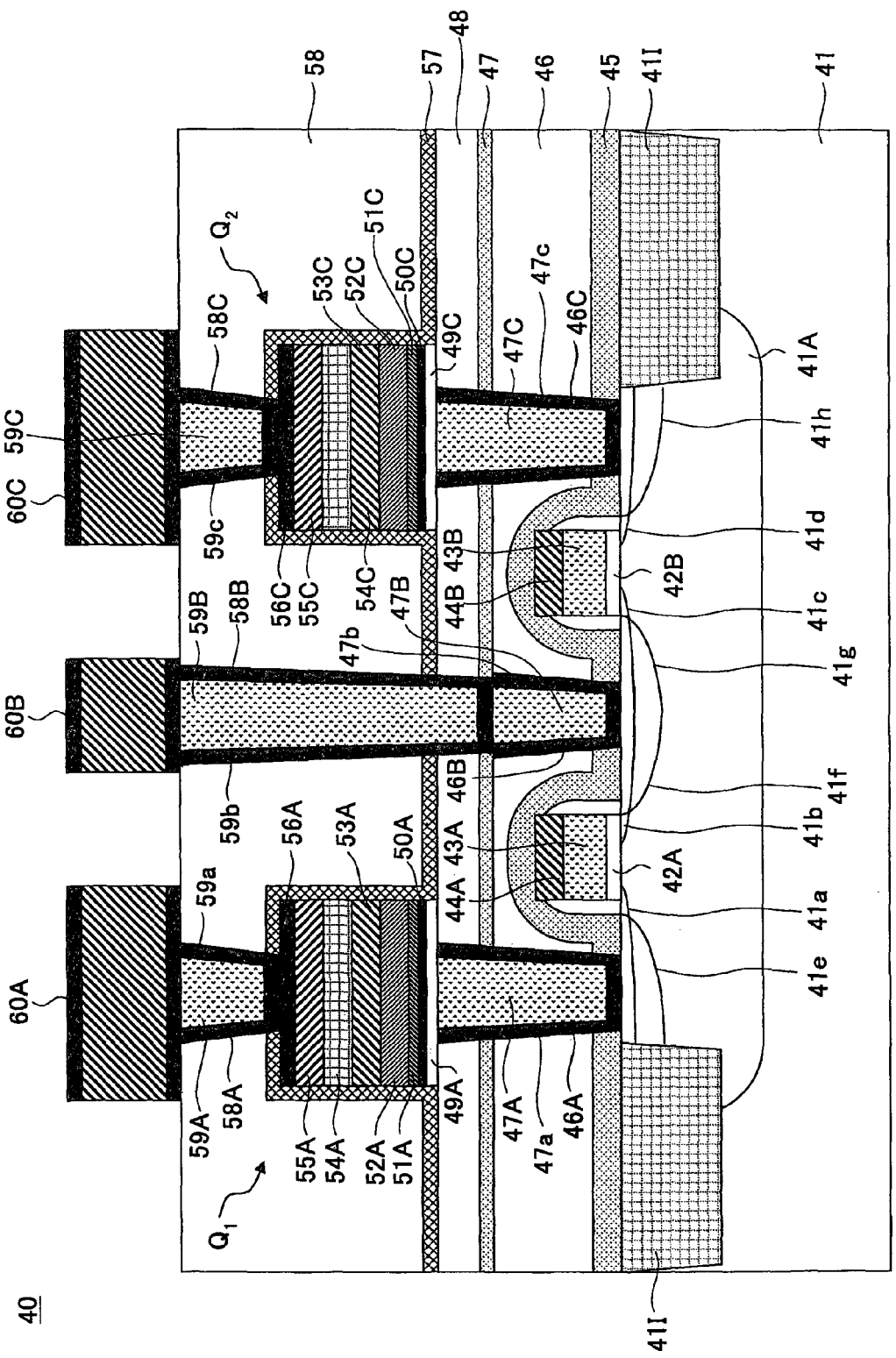

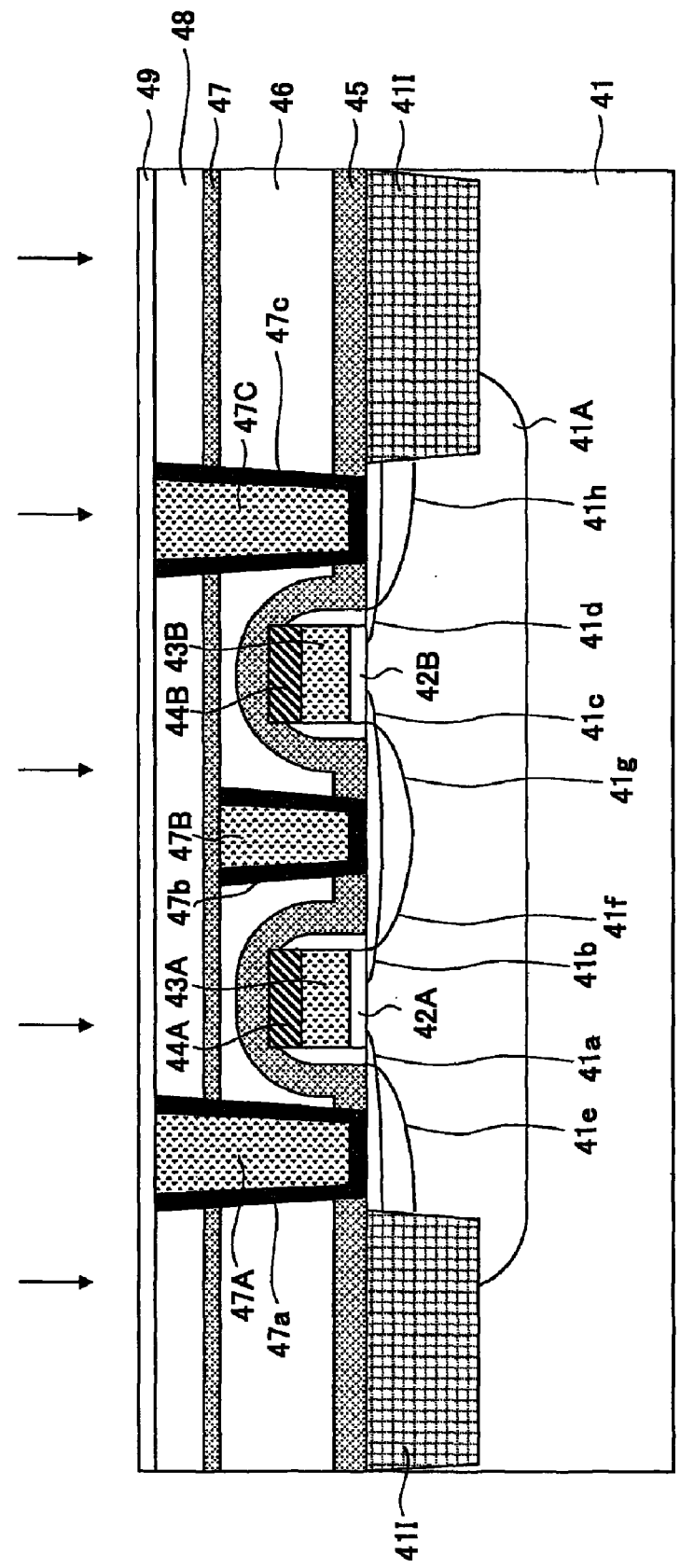

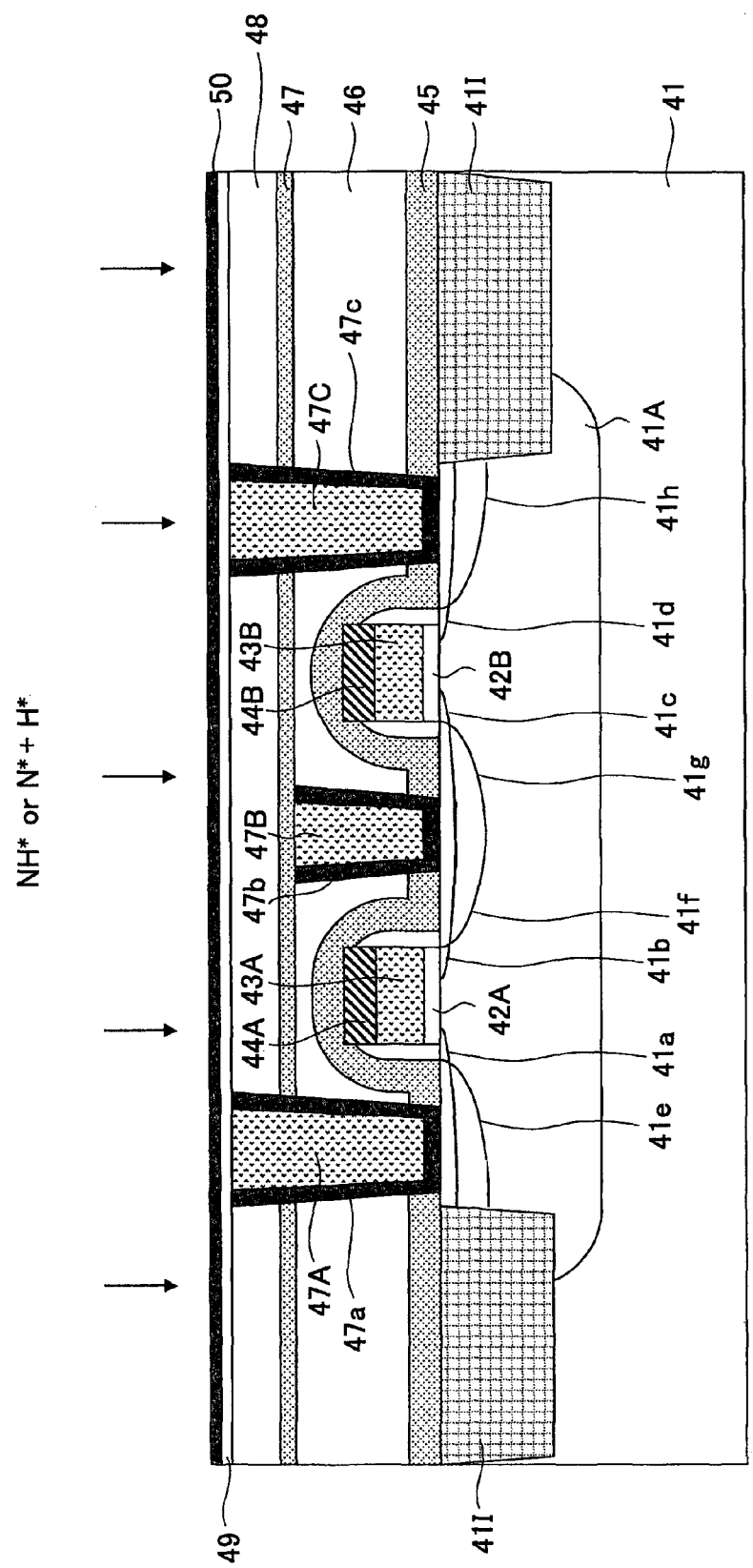

FERROELECTRIC MEMORY DEVICE AND FABRICATION PROCESS THEREOF, FABRICATION PROCESS OF A SEMICONDUCTOR DEVICE

CROSS-REFERENCE TO RELATED APPLICATION

This is a divisional application of U.S. patent application Ser. No. 11/315,212, filed on Dec. 23, 2005, currently pending, which claims the benefit of priority from the prior Japanese Patent Application No. 2005-253909, filed on Sep. 1, 2005, the entire contents of which are incorporated herein by references.

BACKGROUND OF THE INVENTION

The present invention generally relates to semiconductor devices and more particularly to a semiconductor device having a ferroelectric capacitor and fabrication process thereof.

A ferroelectric memory is a non-volatile voltage-driven semiconductor memory device and is characterized by preferable feature of high operational speed, low electric power consumption and non-volatility of information in that the information held therein is retained even when the electric power is turned off. Ferroelectric memories are already used in IC cards and other portable electronic apparatuses.

REFERENCES

Patent Reference 1 the Japanese Laid-Open Patent Application 2004-153031 official gazette FIG. 1 is a cross-sectional diagram showing the construction of a ferroelectric memory device 10 called stacked type device.

Referring to FIG. 1, the ferroelectric memory device 10 is a so-called 1T1C device and includes two memory cell transistors formed in a device region 11A defined on a silicon substrate 11 by a device isolation region 11I such that the two memory cell transistors share a bit line.

More specifically, there is formed an n-type well in the silicon substrate 11 as the device region 11A, wherein there are formed, on the device region 11A, a first MOS transistor having a polysilicon gate electrode 13A and a second MOS transistor having a polysilicon gate electrode 13B via respective gate insulation films 12A and 12B.

Further, LDD regions 11a and 11b of p⁻_type are formed in the silicon substrate 11 in correspondence to respective sidewalls of the gate electrode 13A. Similarly, LDD regions 11c and 11d of p⁻-type are formed in the silicon substrate 11 in correspondence to respective sidewalls of the gate electrode 13B. Thereby, the first and second MOS transistors are formed commonly in the device region 11A, and thus, the same p⁻type diffusion region is used as the LDD region 11b and the LDD region 11c.

On the polysilicon gate electrode 13A, there is formed a silicide layer 14A, while on the polysilicon gate electrode 13B, there is formed a silicide layer 14B. Further, respective sidewall insulation films are formed on both sidewall surfaces of the polysilicon gate electrodes 13A and 13B.

Furthermore, diffusion regions 11e and 11f of p⁺-type are formed in the silicon substrate 11 at respective outer sides of the sidewall insulation films of the gate electrode 13A, and diffusion regions 11g and 11h of p⁺-type are formed in the silicon substrate 11 at respective outer sides of the sidewall insulation films of the gate electrode 13B. Thereby, the same p⁺-type diffusion region is used commonly for the diffusion regions 11f and 11g.

Further, on the silicon substrate 11, there is formed an SiON film 15 so as to cover the gate electrode 13A including the silicide layer 14A and the sidewall insulation films of the gate electrode 13A and so as to cover the gate electrode 13B including the silicide layer 14B and the sidewall insulation films on the gate electrode 13B, and an interlayer insulation film 16 of $SiO_2$ is formed on the SiON film 15.

Further, contact holes 16A, 16B and 16C are formed in the interlayer insulation film 16 so as to expose the diffusion region 11e, the diffusion region 11f (the diffusion region 11g), and the diffusion region 11h, respectively, wherein via-plugs 17A, 17B and 17C of W (tungsten) are formed in the respective contact holes 16A, 16B and 16C via adhesive layers 17a, 17b and 17c, wherein each of the adhesive layers 17a, 17b and 17c is formed by lamination of a Ti film and a TiN film.

Further, on the interlayer insulation film 16, there is formed a first ferroelectric capacitor C1 in which a lower electrode 18A, a polycrystalline ferroelectric film 19A and an upper electrode 20A are stacked in contact with the tungsten plug 17A. Similarly, a second ferroelectric capacitor C2 is formed on the interlayer insulation film 16 by stacking of a lower electrode 18C, a polycrystalline ferroelectric film 19C and an upper electrode 20C in contact with the tungsten plug 17C.

Further, a hydrogen barrier film 21 of $Al_2O_3$ is formed on the interlayer insulation film 16 so as to cover the ferroelectric capacitors C1 and C2, and a next interlayer insulation film 22 is formed further on the hydrogen barrier film 21.

Further, in the interlayer insulation film 22, there are formed a contact hole 22A exposing the upper electrode 20A of the ferroelectric capacitor C1, a contact hole 22B exposing the via-plug 17B, and a contact hole 22C exposing the upper electrode 20C of the ferroelectric capacitor C2, wherein the contact holes 22A-22C are formed respectively with tungsten plugs 23A, 23B and 23C via respective adhesive layers 23a, 23b and 23c formed by lamination of a Ti film and a TiN film.

Further, Al interconnection patterns 24A, 24B and 24 C are formed on the interlayer insulation film 22 respectively in correspondence to the tungsten plugs 23A, 23B and 23C with a barrier metal film of the Ti/TiN layered structure.

SUMMARY OF THE INVENTION

In such a ferroelectric memory device, crystal orientation of the ferroelectric films 19A and 19C in the ferroelectric capacitors C1 and C2 is important.

The so-called perovskite film such as PZT ($Pb(Zr,Ti)O_3$) belongs to tetragonal crystal system, and spontaneous polarization characterizing ferroelectricity is caused by displacement of Zr or Ti atoms in the crystal lattice in the c-axis direction.

Thus, when forming a capacitor insulation film of a ferroelectric capacitor by using such a polycrystalline perovskite film, it is ideal that the individual crystal grains constituting the ferroelectric film have respective c-axes aligned in a direction parallel to the direction in which the electric field is applied, and hence perpendicularly to the surface of the capacitor insulation film ((001) orientation). Contrary to this, when the c-axis has aligned in an in-plane direction of the capacitor insulation film (100 orientation), it is not possible to induce the desired spontaneous polarization even when a drive voltage is applied to the capacitor.

However, the difference between the c-axis and the a-axis small in the perovskite film, and there arises a situation, when the PZT film is formed by a usual manufacturing method, that the crystal grains of the (001) orientation and the crystal grains of the (100) orientation occur more or less with the same proportion. Further, by taking into consideration the fact that there may occur crystal grains of other directions, the proportion of the crystal grains that contribute to the operation of the ferroelectric capacitor is small.

Under these circumstances, it has been practiced in the art of ferroelectric memory, to form each of the ferroelectric films 19A and 19C in the form of predominantly (111)-oriented film. Thereby the c-axes of the crystal grains are aligned in the <111>-direction, and large switching electric charge QSW is guaranteed.

In order to realize such orientation control of the ferroelectric film, it is very important to control the crystal orientation of the lower electrodes 18A and 18C, and thus, a Ti film that shows a strong self-organized alignment is used in the lower electrodes 18A and 18C as an orientation control film. Thereby, a metal or conductive oxide film of (111) orientation, such as a film of Ir, Pt, IrOx, RuOx, and the like, is formed on such an orientation control film. The self-oriented Ti film shows a (002) orientation.

However, when a Ti film is used as the orientation control film, there arises a problem, when the deposition of the Ti film is caused on a surface where oxygen atoms are exposed as in the case of a silicon oxide film shown in the example of FIG. 1, in that the highly reactive Ti atoms thus deposited develop immediately a strong bond with the oxygen atoms at the film surface as shown in FIG. 2, and occurrence of the desired self alignment of the Ti film, caused as a result of the Ti atoms moving freely over the film surface, is prevented. Thereby, the proportion of the crystal grains having the desired (002) orientation is decreased in the Ti film thus obtained.

Further, there arises a case in which the c-axes of the crystal grains that constitute the Ti film are aligned obliquely to the principal surface of the oxide film 16 as schematically shown in FIG. 2, and there are formed large number of crystal grains with the orientation other than the (002) orientation.

Thus, Patent Reference 1 describes the technology of bonding NH groups to the oxygen atoms at the surface of the interlayer insulation film 16 as shown in FIG. 4 with the timing in which the structure of FIG. 1 has been formed up to the contact plugs 17A-17C as shown in FIG. 3, by processing the surface of the interlayer insulation film 16 with $NH_3$ plasma.

According to such a construction, the Ti atoms deposited on the interlayer insulation film are not captured by the oxygen atoms contrary to the case shown in FIG. 4, and the Ti atoms can move freely over the surface of the interlayer insulation film. Thereby, there is formed a Ti self-organized film having the (002) orientation on the interlayer insulation film 16.

Thus, by forming the lower electrodes 18A and 18C on the Ti film thus formed and further forming the ferroelectric film 19A or 19C thereon, it becomes possible to obtain a ferroelectric film in which the crystal grains are predominantly in the (111) orientation.

In the technology of Patent Reference 1, however, the lower electrode 18A or 18C is formed directly on the W plug 17A or 17C, and thus, it is not possible to shield the influence of the crystal orientation of the crystals constituting the surface of the plugs 17A and 17C. It should be noted that the plugs 17A and 17C are formed of polycrystalline metal such as polycrystalline tungsten, and the like. This means that, in the majority part of the ferroelectric films 19A and 19C, the orientation control by the self-aligned Ti film is not attained effectively.

In a first aspect, the present invention provides a ferroelectric memory device, comprising:

a semiconductor substrate;

a field effect transistor formed on said semiconductor substrate, said field effect transistor including first and second diffusion regions;

an interlayer insulation film formed on said semiconductor substrate so as to cover said field effect transistor;

a conductive plug formed in said interlayer insulation film in contact with said first diffusion region; and a ferroelectric capacitor formed over said interlayer insulation in contact with said conductive plug, said ferroelectric capacitor comprising a ferroelectric film and upper and lower electrodes sandwiching said ferroelectric film respectively from above and below, said lower electrode being connected electrically to said conductive plug, a layer containing oxygen being interposed between said the conductive plug and said lower electrode, a layer containing nitrogen being interposed between said layer containing oxygen and said lower electrode, a self-aligned layer being interposed between said layer containing nitrogen and said lower electrode.

In an other aspect, the present invention provides a fabrication method of a ferroelectric memory apparatus, comprising the steps of:

forming an interlayer insulation film on a semiconductor substrate on which a transistor is formed so as to cover said transistor;

forming a conductive plug in said interlayer insulation film in contact with said diffusion region of said transistor; and forming a ferroelectric capacitor on said conductive plug by consecutively stacking a lower electrode, a ferroelectric film and an upper electrode, wherein there is provided, after said step of forming said conductive plug but before said step of forming said lower electrode, the steps of: forming a layer containing oxygen on said interlayer insulation film and a surface of said conductive plug; forming a layer containing nitrogen on a surface of said layer containing oxygen; and forming a self-alignment film on said layer containing nitrogen.

In another aspect, the present invention provides a fabrication method of a semiconductor device having a function film, comprising the steps of:

forming an interlayer insulation film on a semiconductor substrate on which a transistor is formed so as to cover said transistor;

forming a conductive plug in said interlayer insulation film in contact with said diffusion region of said transistor; and forming a functional film on said conductive plug, wherein there is provided, after said step of forming said conductive plug but before said step of forming said functional film, the steps of: forming a layer containing oxygen on said interlayer insulation film and a surface of said conductive plug; forming a layer containing nitrogen on a surface of said layer containing oxygen; and forming a self-alignment film on said layer containing nitrogen.

According to the present invention, it becomes possible, with the semiconductor device having a functional film of normally polycrystalline state such as a ferroelectric capacitor, on a conductive plug, to shield the effect of the crystal orientation of the crystal grains constituting the conductive plug. Further, by covering the layer containing oxygen with the layer containing nitrogen, the problem that the element such as Ti constituting the self-aligned layer is captured by the oxygen atoms in the layer that contains oxygen and the self-aligned layer can no longer develop the expected self-alignment is successfully overcome, and the degree of alignment of the self-aligned layer is improved even in the part thereof which is located directly over the conductive plug. With this, the alignment of the functional film such as the ferroelectric capacitor formed on the self-aligned layer is improved.

Other objects and further features of the present invention will become apparent from the following detailed description when read in conjunction with the attached drawings.

BRIEF DESCRIPTION OF THE DRAWINGS

FIG. 5 is a diagram showing the construction of a ferroelectric memory device according to a first embodiment of the present invention;

FIGS. 6A-6M are diagrams showing the fabrication process of a ferroelectric memory device of FIG. 5;

DETAILED DESCRIPTION OF THE INVENTION

First Embodiment

Figure 1:
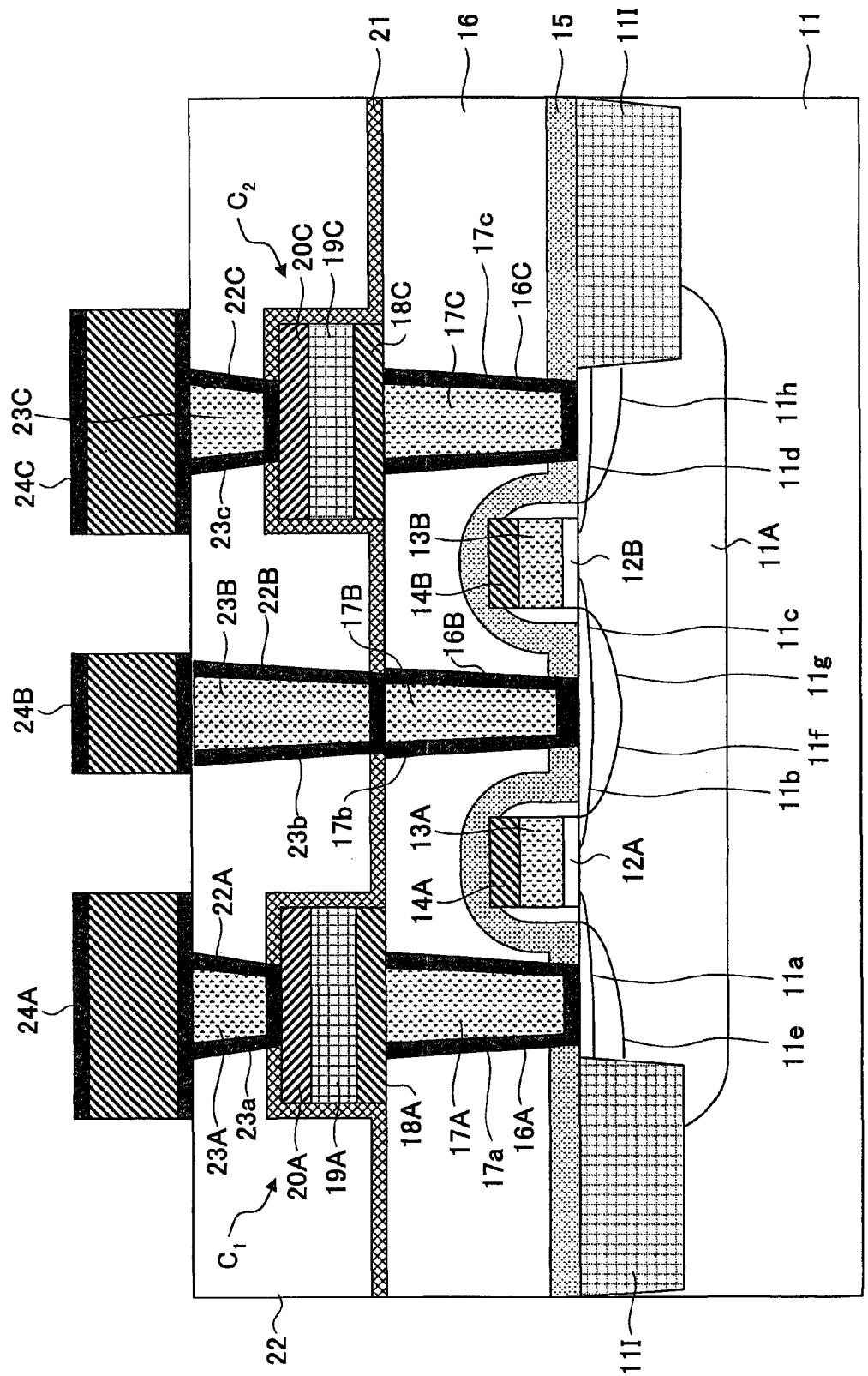
FIG. 1 a diagram showing the construction of a conventional ferroelectric memory device.
Figure 2:
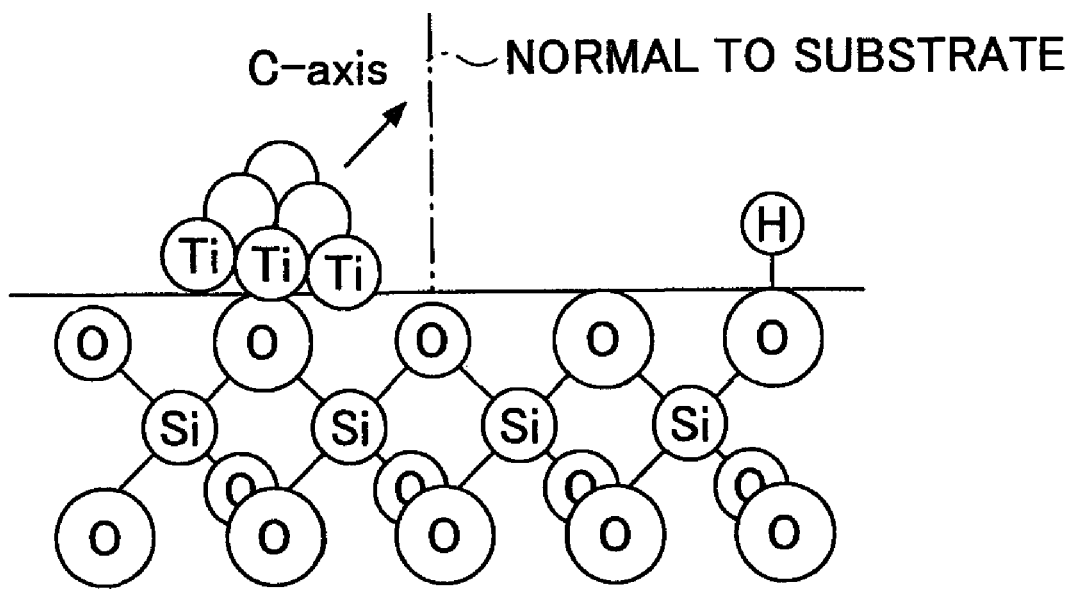
FIG. 2 is a diagram explaining the problems of conventional technology.
Figure 3:
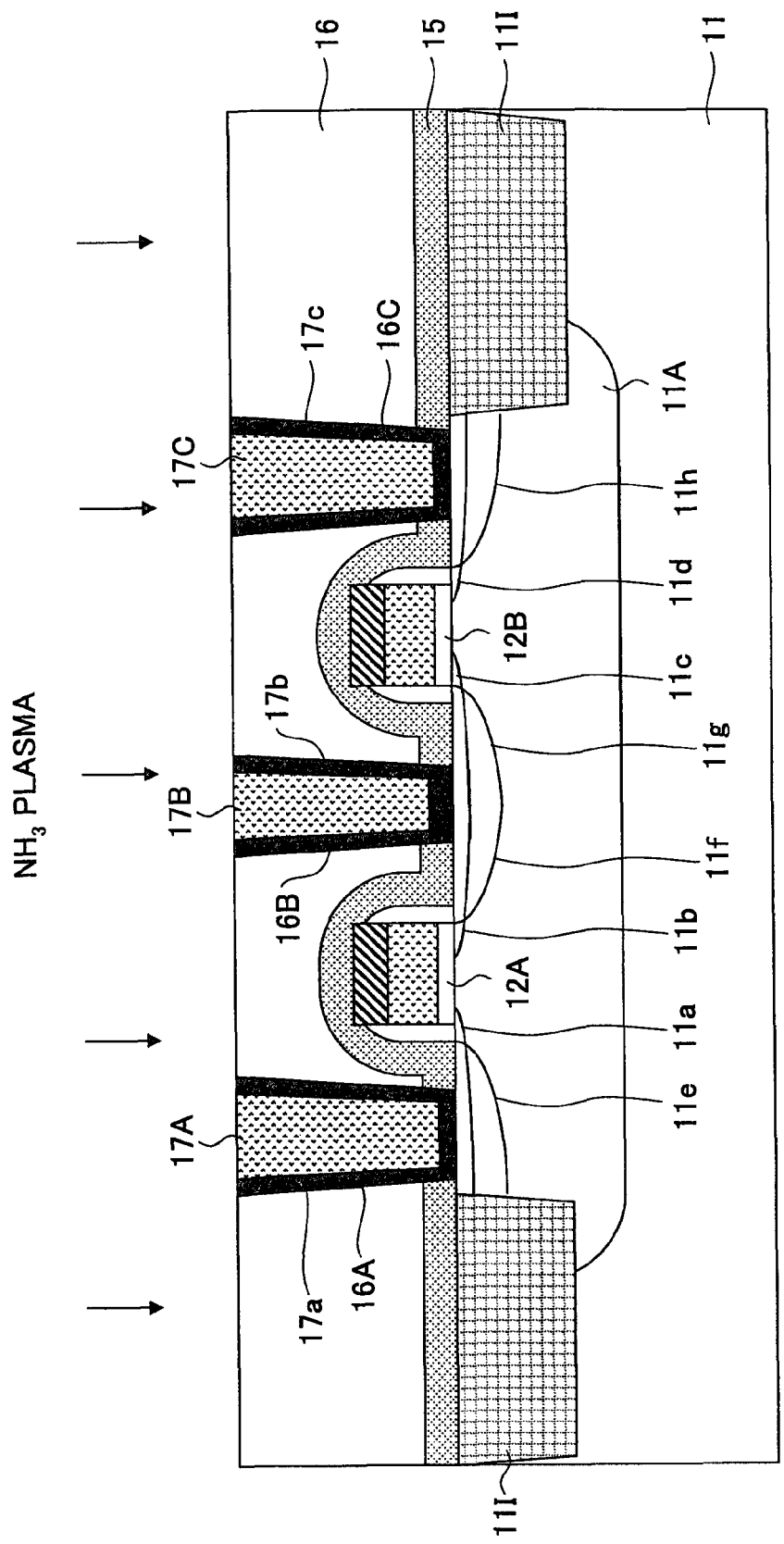
FIG. 3 is a diagram explaining a related art of the present invention.

FIG. 5 shows the construction of a ferroelectric memory 40 according to a first embodiment of the present invention.

Referring to FIG. 5, the ferroelectric memory device 40 is a so-called 1T1 C type device and includes two memory cell transistors formed in a device region 41A defined on a silicon substrate 41 by a device isolation region 41I of STI (shallow trench isolation) type, so as to share a bit line.

More specifically, there is formed an n-type well in the silicon substrate 41 as the device region 41A, wherein there are formed a first MOS transistor having a polysilicon gate electrode 43A and a second MOS transistor having a poly-silicon gate electrode 43B on the device region 41A respectively via a gate insulation film 42A and a gate insulation film 42B.

In the silicon substrate 41, there are formed LDD regions 41a and 41b of p$^-$-type in correspondence to respective sidewalls of the gate electrode 43A, and there are further formed LDD regions 41c and 41d of p$^-$-type in correspondence to respective sidewalls of the gate electrode 43B. Here it should be noted that because the first and second MOS transistors are formed in the device region 41A commonly, the same p$^-$-type diffusion region is used as the LDD region 41b and the LDD region 41c.

On the polysilicon gate electrode 43A, there is formed a silicide layer 44A, while a silicide layer 44B is formed on the polysilicon gate electrode 43B, and sidewall insulation films are formed on the respective sidewall surfaces of the polysilicon gate electrode 43A. Similarly, sidewall insulation films are formed on the respective sidewall surfaces of the polysilicon gate electrode 43B.

Further, diffusion regions 41e and 41f of p$^+$-type are formed in the silicon substrate 41 at respective outer sides of the sidewall insulation films of the gate electrode 43A, and diffusion regions 41g and 41h of p$^+$-type are formed in the silicon substrate 41 at respective outer sides of the sidewall insulation films of the gate electrode 43B. Here, it should be noted that the diffusion regions 41f and 41g are formed of the same p$^+$-type diffusion region.

Further, there is formed a SiON film 45 on the silicon substrate 41 so as to cover the silicide layer 44A and the gate electrode 43A including the sidewall insulation films formed thereon and so as to cover the silicide layer 44B and the gate electrode 43B including the sidewall insulation films formed thereon.

On the SiON film 45, an interlayer insulation film 46 of $SiO_2$, a first antioxidation film 47 of SiN or SiON, and an interlayer insulation film 48 of TEOS are formed consecutively.

Further, contact holes 46A and 46C are formed through the interlayer insulation films 46 and 48 and also through the antioxidation film 47 so as to expose the diffusion regions 41e and 41h, and via-plugs 47A and 47C of W (tungsten) are formed in the contact holes 46A and 46C respectively via adhesive layers 47a and 47c, wherein the adhesive layers 47a and 47c are formed of lamination of a Ti film and a TiN film. Further, a contact hole 46B is formed in the interlayer insulation film 46 so as to expose the diffusion region 41f and thus, the diffusion region 41g, wherein a via-plug 47B of W is formed in the contact hole 46B via an adhesive layer 47b, wherein the adhesive layer 47b is formed of lamination of a Ti film and a TiN film similarly to he adhesive layers 47a and 47c.

Furthermore, there is formed a first ferroelectric capacitor Q1 on the interlayer insulation film 48 in contact with the tungsten plug 47A, wherein the first ferroelectric capacitor Q1 is formed of a lower electrode in which a TiAlN film 52A of the thickness of 100 nm and an Ir film 53A of the thickness of 100 nmm are laminated, and a polycrystalline ferroelectric film 54A of PZT is formed thereon with a thickness of 120 nm. Further, and an upper electrode 55A of $IrO_2$ is formed on the ferroelectric film 24A with a thickness 200 nm.

Similarly, there is formed a second ferroelectric capacitor Q2 in contact with the tungsten plug 47C, such that the second ferroelectric capacitor Q2 is formed of a lower electrode in which a TiAlN film 52C of the thickness of 100 nm and an Ir film 53C of the thickness of 100 nmm are laminated, and a polycrystalline ferroelectric film 54C of PZT is formed thereon with a thickness of 120 nm. Further, an upper electrode 55C of $IrO_2$ is formed on the ferroelectric film 54C with a thickness 200 nm.

Thereby, there is interposed an insulation layer 49A containing Si and oxygen and having the thickness of one or more molecular layers but not exceeding 10 nm between the conductive plug 47A and the lower electrode (TiAlN layer 52A) in the present embodiment, such that the insulation layer 49A has a composition of predominantly $SiO_2$, and there is further formed a layer 50A containing nitrogen atoms on the insulation layer 49A such that the nitrogen atoms in the layer 50A form a bond to the oxygen atoms in the insulation layer 49A. Further, a Ti film 51A having a (002) orientation is formed on the layer 50A thus containing nitrogen in the present embodiment, with the thickness of 20 nm.

Similarly, there is interposed an insulation layer 49C containing Si and oxygen and having the thickness of one or more molecular layers but not exceeding 10 nm between the conductive plug 47B and the TiAlN layer 52C constituting the lower electrode such that the insulation layer 49C has a composition of predominantly $SiO_2$, and a layer 50C containing nitrogen atoms is formed on the insulation layer 49C such that the nitrogen atoms in the layer 49C form a bond to the oxygen atoms in the insulation layer 49C. Further, a Ti film 51C having a (002) orientation is formed on the layer 50C thus containing nitrogen in the present embodiment with the thickness of 20 nm.

With such a construction, the orientation of the lower electrode films 52A and 53A formed on the Ti film 51A of the (002) orientation is aligned in the <111> direction, and because of this, the PZT film 54A formed thereon has an orientation aligned in the <111> direction. Similarly, the orientation of the lower electrode films 52C and 53C formed on the Ti film 51C of the (002) orientation is aligned in the <111> direction, and because of this, the PZT film 54C formed thereon has an orientation aligned in the <111> direction. As a result, the ferroelectric capacitors Q1 and Q2 have a large switching electric charge QSW.

Further, there is formed a hydrogen barrier film 57 of $Al_2O_3$ is formed on the interlayer insulation film 48 with the film thickness of 10 nm so as to cover the ferroelectric capacitors Q1 and Q2, and a next interlayer insulation film 58 is formed on the hydrogen barrier film 57.

Further, there are formed a contact hole 58A exposing the hydrogen barrier metal film 56A on the upper electrode 55A of the ferroelectric capacitor Q1, a contact hole 58B exposing the via-plug 46B, and a contact hole 58C exposing the hydrogen barrier metal film 56C on the upper electrode 55C of the ferroelectric capacitor Q2 in the interlayer insulation film 58, wherein a tungsten plug 59A is formed in the contact hole 58A via an adhesive layer 59a in which a Ti film and a TiN film are laminated, a tungsten plug 59B is formed in the contact hole 58B via an adhesive layer 59b in which a Ti film and a TiN film are laminated, and a tungsten plug 59C is formed in the contact hole 58C via an adhesive layer 59c in which a Ti film and a TiN film are laminated.

Further, in correspondence to the tungsten plugs 59A, 59B and 59C, there are formed Al interconnection patterns 60A, 60B and 60C on the interlayer insulation film 58 each with a corresponding barrier metal film of Ti/TiN laminated structure.

In the present embodiment, it is obvious that the conductivity type can be reversed.

Next, the fabrication process of the ferroelectric memory device 40 of FIG. 5 will be explained with reference to FIGS. 6A-6M.

Figure 6A:
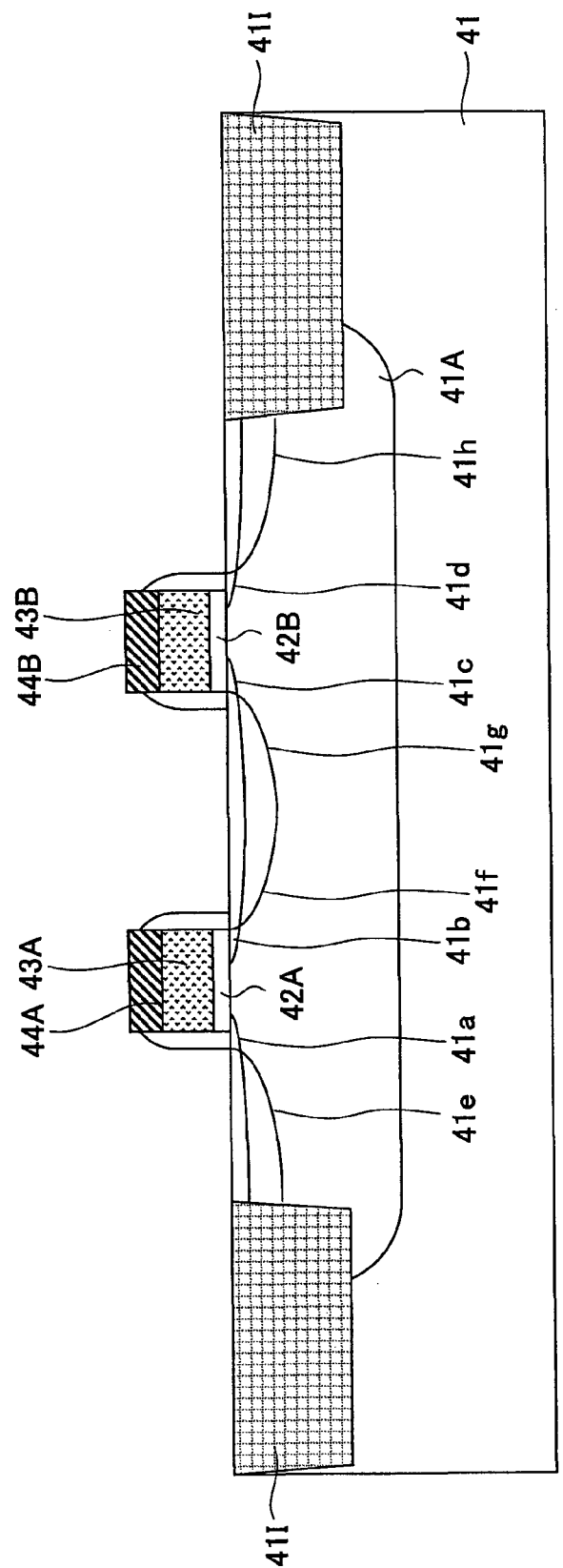

Referring to FIG. 6A, the substrate 41 is a silicon substrate of p-type or n-type and the device region 41A is defined in the substrate 41 in the form of an n-type well by the STI device isolation structure 41I.

On the device region 41A, there are formed a polysilicon gate electrode 43A of the first MOS transistor and a polysilicon gate electrode 43B of the second MOS transistor, via respective gate insulation films 42A and 42B.

Further, in the silicon substrate 41, there are formed LDD regions 41a and 41b of the $p^-$-type in correspondence to respective sidewalls of the gate electrode 43A and LDD regions 41c and 41d of $p^-$-type are formed in correspondence to respective sidewalls of the gate electrode 43B by conducting an ion implantation process while using the gate electrodes 43A and 43B as a self-aligned mask.

Because the first and second MOS transistors are formed commonly in the device region 41A, the LDD region 41b and the LDD region 41c are formed by the same $p^-$-type diffusion region.

On the polysilicon gate electrodes 43A and 43B, there are formed silicide layers 44A and 44B, respectively, and there are further formed sidewall insulation films on the sidewall surfaces of the polysilicon gate electrode 43A and on the sidewall surfaces of the polysilicon gate electrode 43B, respectively.

Further, in the silicon substrate 41, the diffusion regions 41e and 41f of $p^+$-type are formed at respective outer sides of the sidewall insulation films of the gate electrode 43A and diffusion regions 41g and 41h of $p^+$-type are formed at respective outer sides of the sidewall insulation films of the gate electrode 43B, by conducting an ion implantation process that uses the gate electrodes 43A and 43B and the respective sidewall insulation films as a self-aligned mask. Thereby, it should be noted that the diffusion regions 41f and 41g are formed of the same $p^+$-type diffusion region.

Figure 6B:
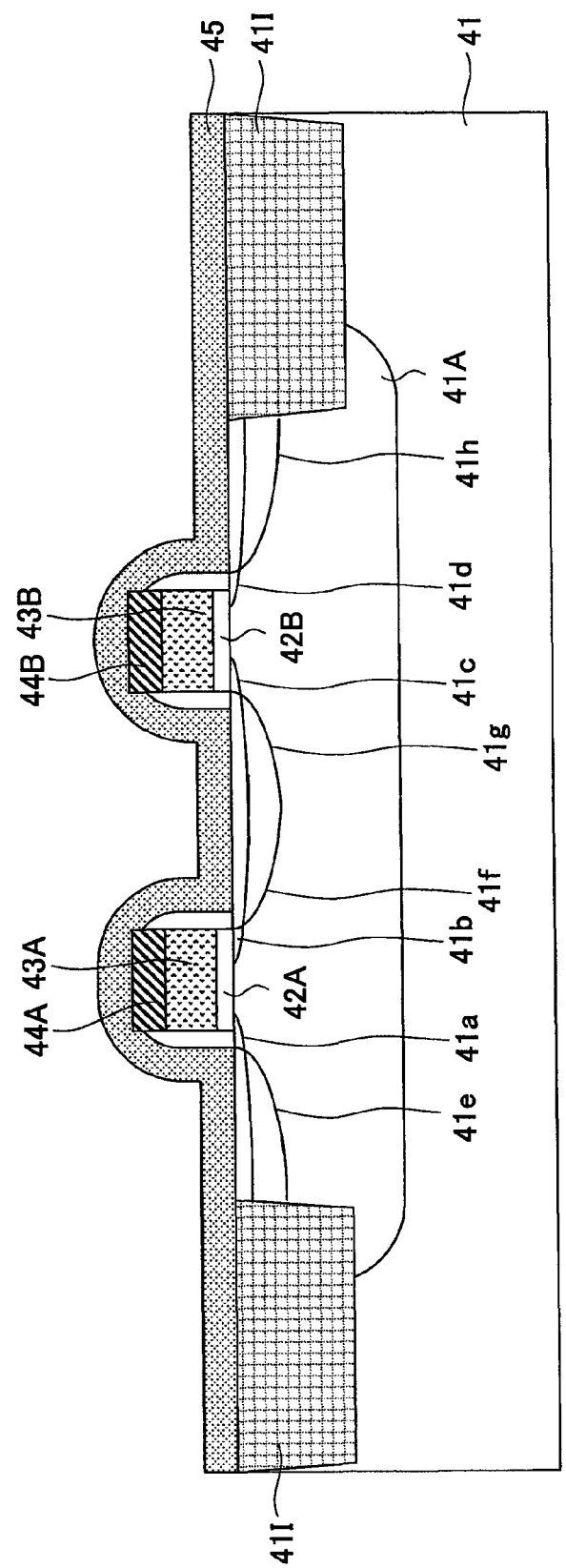

Next, in the step of FIG. 6B, an SiON film 45 is formed on the structure of FIG. 6A by a plasma CVD process with a thickness of about 200 nm.

Figure 6C:
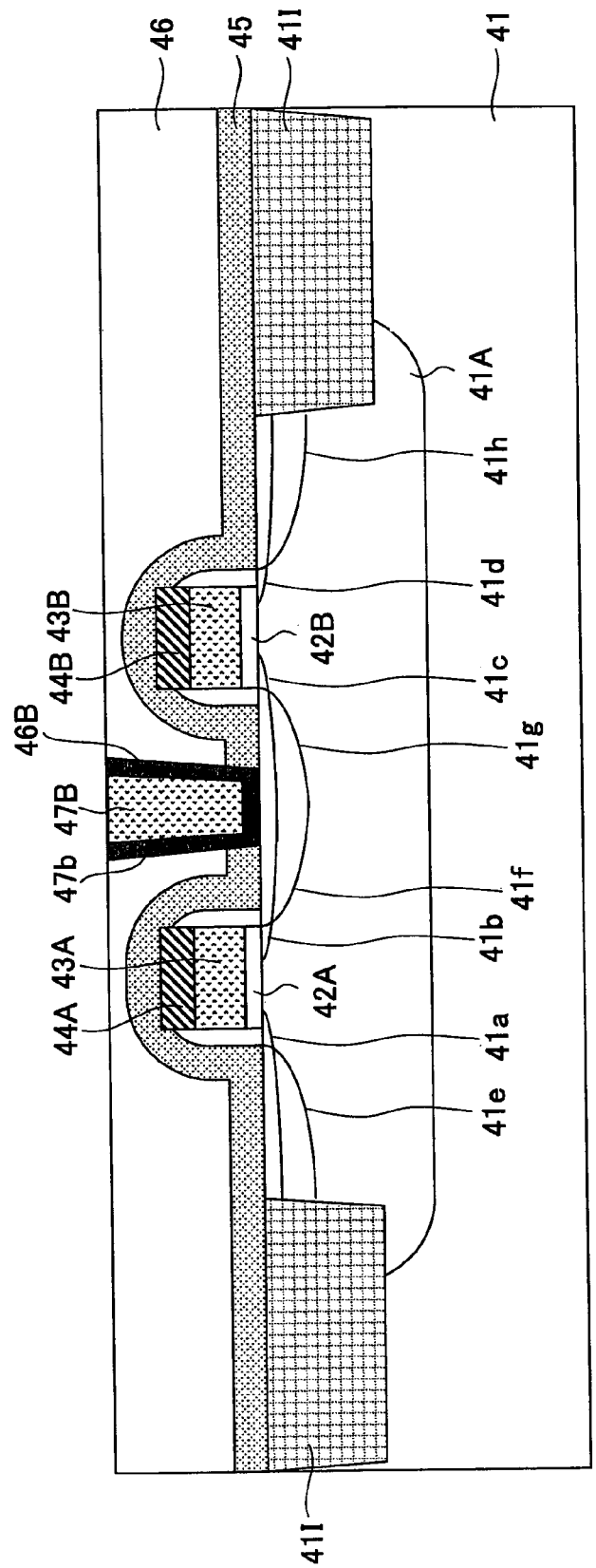

Next, in the step of FIG. 6C, a silicon oxide film having a thickness of 20 nm, a silicon nitride film having a thickness of 80 nm and a silicon oxide film having a thickness of 1000 nm are deposited consecutively on the structure of FIG. 6B by a plasma CVD process, and the structure thus formed is further planarized by a CMP process such that the interlayer insulation film 46 has a thickness of 700 nm.

Further, in the step of FIG. 6C, the interlayer insulation film 46 is formed with the contact hole 46B having a diameter of 0.25 μm, for example, so as to expose the diffusion region 46f (46g), and the contact hole 46B is formed with the W plug 47B so as to make electrical contact with the diffusion region 46f (46g), wherein the W plug 47B is formed by filling the contact hole 46B with a W film by conducting a CVD via an adhesion film 47b in which a Ti film having the thickness of 30 nm and a TiN film having the thickness of 20 nm are laminated. Thereafter, a CMP process is conducted for removing excessive W film.

Figure 6D:
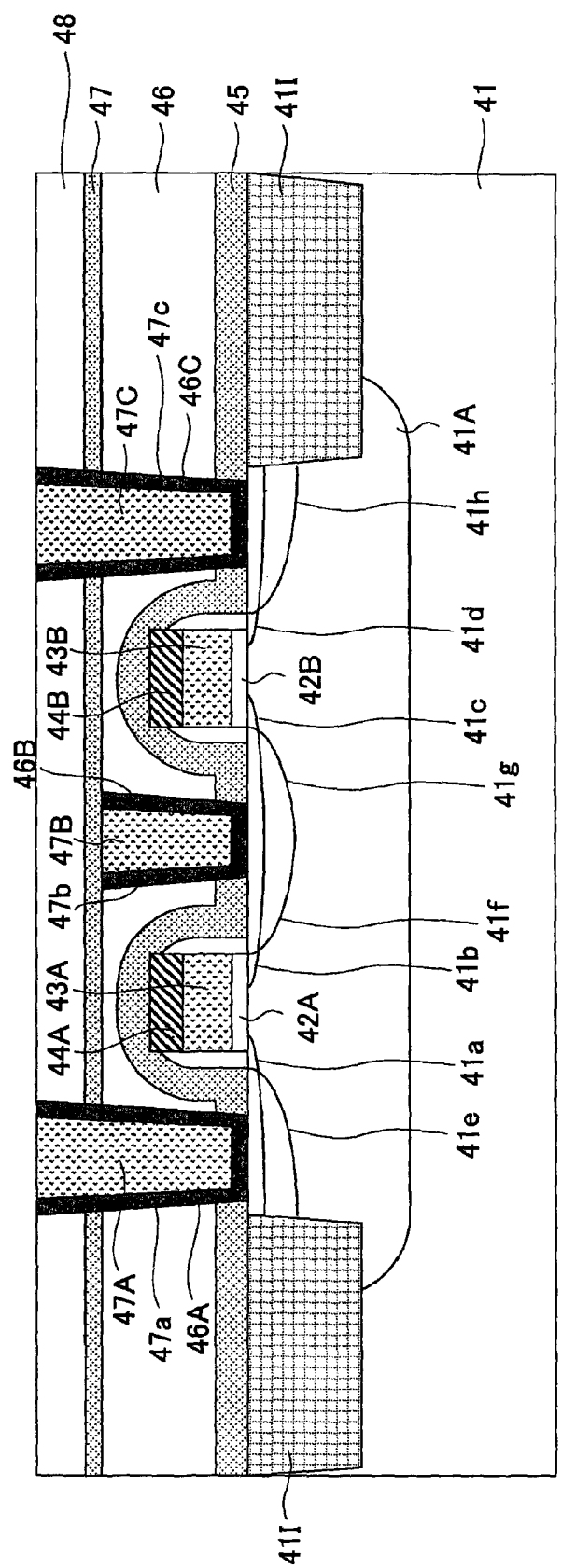

Next in the step of FIG. 6D, the first antioxidation film 47 of SiON is formed on the structure of FIG. 6C by a plasma CVD process with the film thickness of 130 nm, for example, and the silicon oxide film 48 is formed further thereon by a plasma CVD process that uses TEOS as the source material with the film thickness of 130 nm, for example.

Further, in the structure of FIG. 6D, the contact holes 46A and 46C are formed so as to penetrate through the interlayer insulation films 48 and 46 and the SiON film 47 such that the diffusion regions 41e and 41h are exposed, and the W plug 47A is formed in the contact hole 46A in electrical contact with the diffusion region 41e via the adhesive layer 47a similar to the adhesive layer 47b, as in the case of the W plug 47B. Further, the W plug 47C is formed in the contact hole 46C in electrical contact with the diffusion region 41h via the adhesive layer 47c similarly to the adhesive layer 47b, as in the case of the W plug 47B.

Now, the present invention shields, when forming the ferroelectric capacitors Q1 and Q2 on the structure of FIG. 6D, the influence of the crystal orientation of the W plugs 47A and 47C exerted to the ferroelectric capacitors Q1 and Q2 by conducting the process of FIG. 6E.

Figure 7:
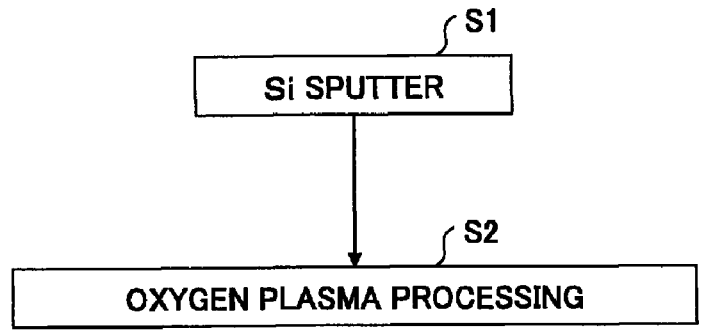
FIG. 7 is a flowchart showing an example of the process of FIG. 6E.

Thus, in the step of FIG. 6E, a layer containing Si is formed on the structure of FIG. 6D as shown in a step 1 of FIG. 7 by a sputtering process, for example, with the thickness of 10-15 nm. Further, by applying an oxygen plasma processing to the layer thus formed in a step 2 of FIG. 7, the layer containing Si is converted to the silicon oxide film 49 having the thickness of about 2 nm. Such sputtering process can be conducted for example in an Ar ambient of the pressure of 1-2 Pa at the substrate temperature of the room temperature to 350° C. while using a Si target and supplying a sputtering power of 0.5-1 kilowatts. In this case, the distance between the substrate and the target is set to 60 mm. Thereby, it is not necessary to form the Si layer in a continuous film, and the Si layer may contain pinholes or may be a discontinuous film showing island structure.

As will be understood from the structure explained previously with reference to FIG. 5, such silicon oxide film 49 tends to cause to increase of contact resistance of the ferroelectric capacitors Q1 and Q2 to be formed later. Thus, it is preferable to form the silicon oxide film 49 to have a film thickness of 10 nm or less, such that tunneling of electrons is possible.

Alternatively, it is possible to conduct the step of FIG. 6E by a so-called ALD (atomic layer vapor phase deposition) process.

Figure 8:
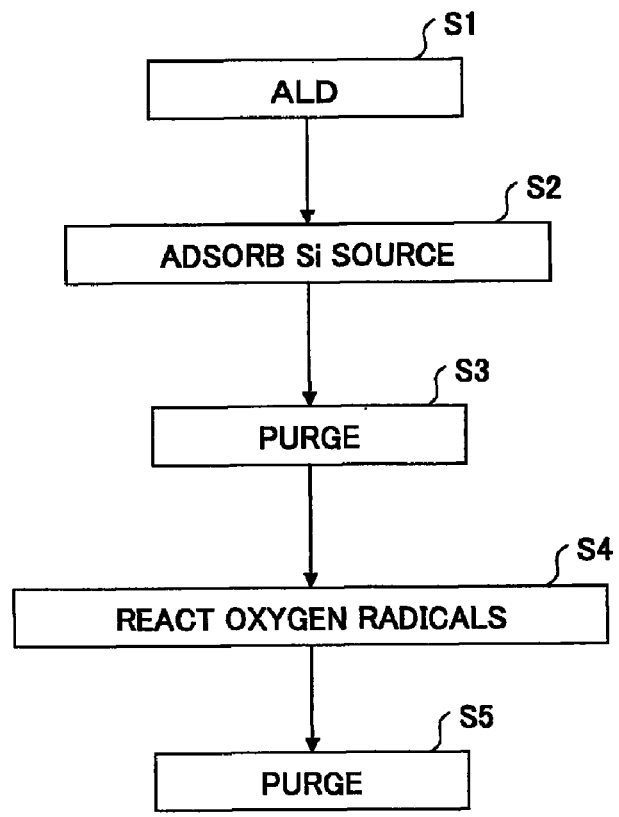
FIG. 8 is a flowchart showing another example for implementing the process of FIG. 6E.

In this case, the structure of FIG. 6D is introduced into a processing vessel of an ALD processing apparatus in a step 1 of FIG. 8 and is held therein at the substrate temperature of 50-400° C. under the pressure of $1-1.013 \times 10^5$ Pa, wherein the substrate temperature is chosen such that there occurs the phenomenon of ALD. Thereafter, as shown in a step 2 of FIG. 8, a source gas containing Si such as $SiH_2Cl_2$ is introduced into the processing vessel together with a hydrogen gas, and chemical absorption is caused for the molecules of the source gas to the surface of the interlayer insulation film 48 for the interval of several seconds.

Thereafter, as shown in a step 3 of FIG. 8, surplus source gas molecules are expelled from the reaction vessel by conducting a purging step, and oxygen radicals are introduced further into the processing vessel in a step 4 of FIG. 8. Thereby, the source gas molecules thus adsorbed to the surface of the interlayer insulation film 48 undergo oxidation, and there is formed an $SiO_2$ film 49 of one molecular layer thickness on the surface of the interlayer insulation film 48 and also on the surface of the conductive plugs 47A and 47B.

After formation of the $SiO_2$ film 49, surplus oxygen gas is expelled from the processing vessel by a purging step as shown in a step 5 of FIG. 8.

It should be noted that such an ALD process can be conducted in an ordinary plasma CVD process by controlling the gas supply sequence and the evacuation sequence according to the flowchart of FIG. 8 explained before.

With such a ALD process, it is possible to form an $SiO_2$ film, in which Si atomic layers and oxygen atomic layers are repeated alternately over plural times, as the silicon oxide film 49, with the thickness of one molecular layer to an arbitrary thickness, by repeating the process of FIG. 8 over plural times. Further, with such an ALD process, it is possible to introduce an oxidizing gas into the processing vessel in the step 4 of FIG. 8 in place of the oxygen plasma.

Figure 9:
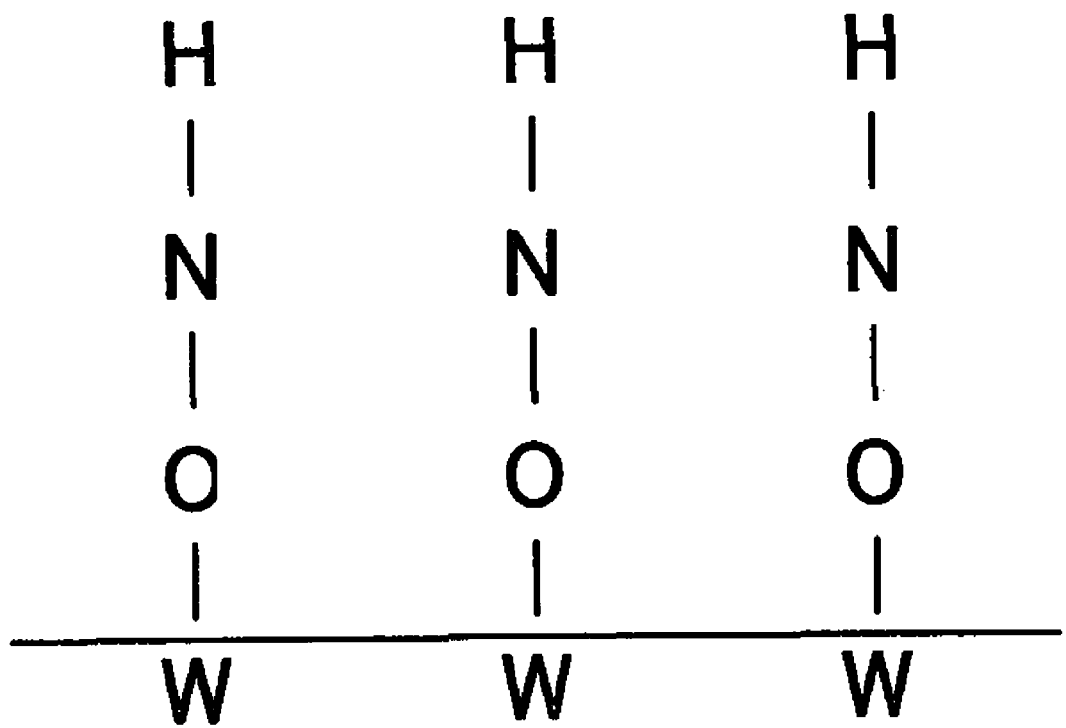
FIG. 9 is a diagram showing further examples of the process of FIG. 6E.

Further, in the step of FIG. 6D, it is possible to react the oxygen radicals to the surface of the W plugs 47A and 47C directly to cover the surface of these plugs by an oxygen atomic layer. In this case, the oxygen atomic layer is formed at the film 49, and a W—O—N—H bond schematically shown in FIG. 9 is formed on the surface of the W plugs 47A and 47C by further conducting a plasma nitridation processing as will be explained below.

Thereby, it should be noted that the crystal orientation of the conductive plus 47A and 47C can be satisfactorily screened by merely covering the surface thereof by at least one molecular layer of $SiO_2$ or at least one atomic layer of oxygen.

Figure 4:
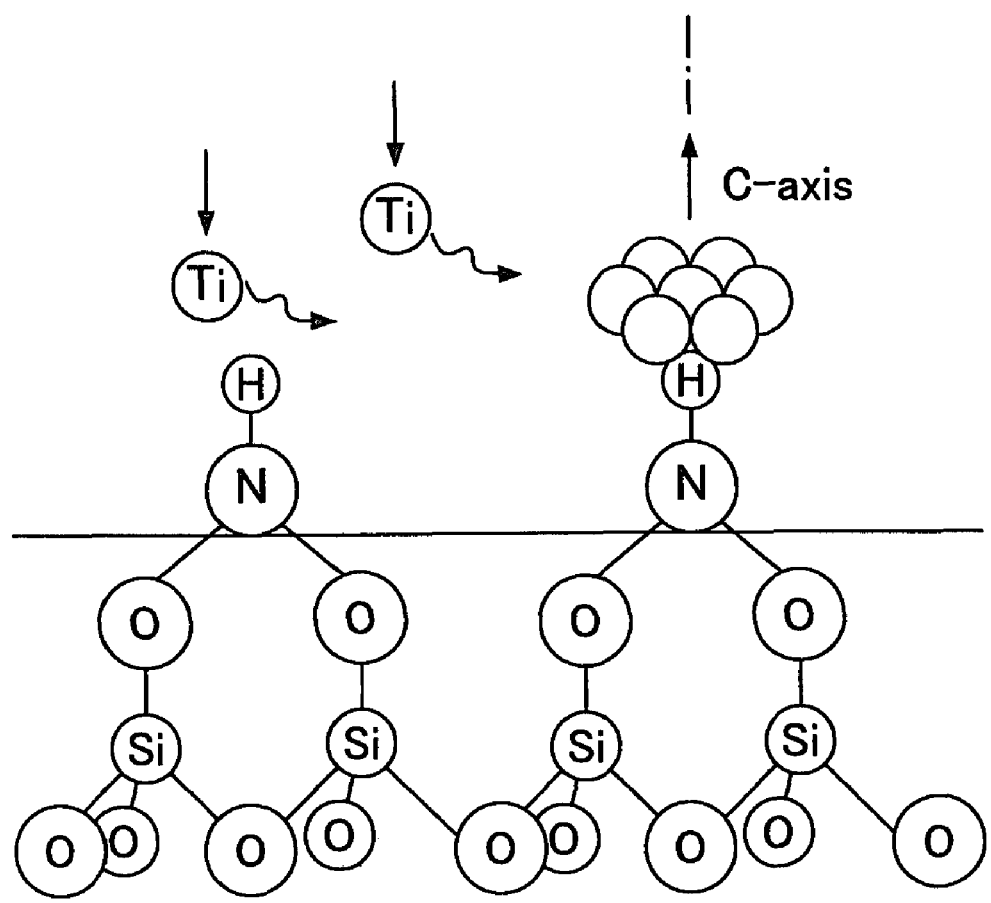
FIG. 4 is a diagram explaining the principle of the related art of FIG. 3.

Next, in the step of the present invention, ammoniac ($NH_3$) plasma is applied to the structure of FIG. 6E in the step of FIG. 6F, and there is formed a nitride film 50 that forms the Si—O—N—H bond explained with reference to FIG. 4.

Such ammonia plasma processing can be conducted in a plasma proceeding apparatus of parallel-plate type having an opposing electrode opposing the substrate to be processed with a distance of about 9 mm (350 mils) under the pressure of 266 Pa (2 Torr) at the substrate temperature of 400° C. while supplying an ammonia gas with a flow rate of 350 sccm and supplying a high frequency power of 13.53 MHz frequency to the substrate to be processed with 100 W and a high frequency power of 350 kHz frequency to the opposing electrode with the power of 55 W for 60 seconds.

With such ammonia plasma processing, there are formed NH radicals in the plasma and, as a result of reaction of the NH radicals upon the surface of the oxide film 49, there is formed the nitride film 50 on the surface of the oxide film 49 in the state terminated with hydrogen as explained with reference to FIG. 4. It is believed thereby that one atomic layer is sufficient for the nitride film 50 covering the surface of the oxide film for the purpose of the present invention.

Alternatively, it is possible to supply a nitrogen gas and a hydrogen gas separately into such a plasma processing apparatus and process the surface of the oxide film 49 by the nitrogen radicals and hydrogen radicals.

Further, the nitridation processing of FIG. 6F is not limited to such a parallel plate plasma processing apparatus but may be conducted by a remote plasma processing apparatus, for example.

Figure 10:
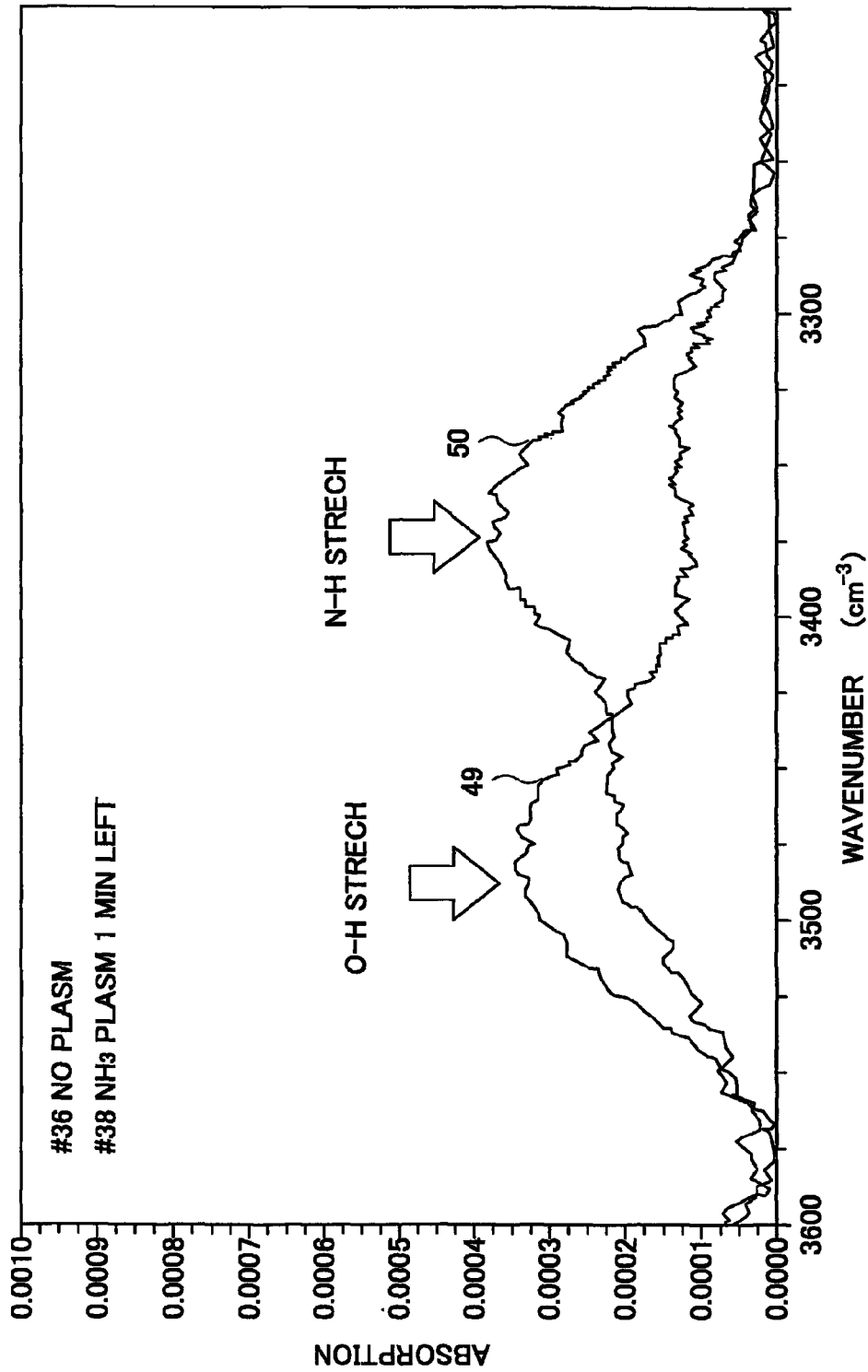
FIG. 10 is a diagram explaining the process of FIG. 6F.

FIG. 10 shows the FTIR spectrum of the oxide film 49 and the nitride film 50 thus obtained.

Referring to FIG. 10, there is observed an absorption peak associated with the O—H stretching vibration in the oxide film 49 of the state of FIG. 6E, while in the nitride film 50 of the state of FIG. 6F, the absorption peak associated with N—H stretching vibration is observed. This indicates that the hydrogen-terminated surface of the oxide film 49 is converted to the hydrogen terminated nitride film 50. Particularly, in such a stacked structure of the oxide film 49 and the nitride film 50 formed in the atomic layer level, it can be regarded that the laminated structure forms an oxynitride film having an oxygen-enriched composition at the bottom part and a nitrogen-enriched composition at the surface part.

Figure 6G:
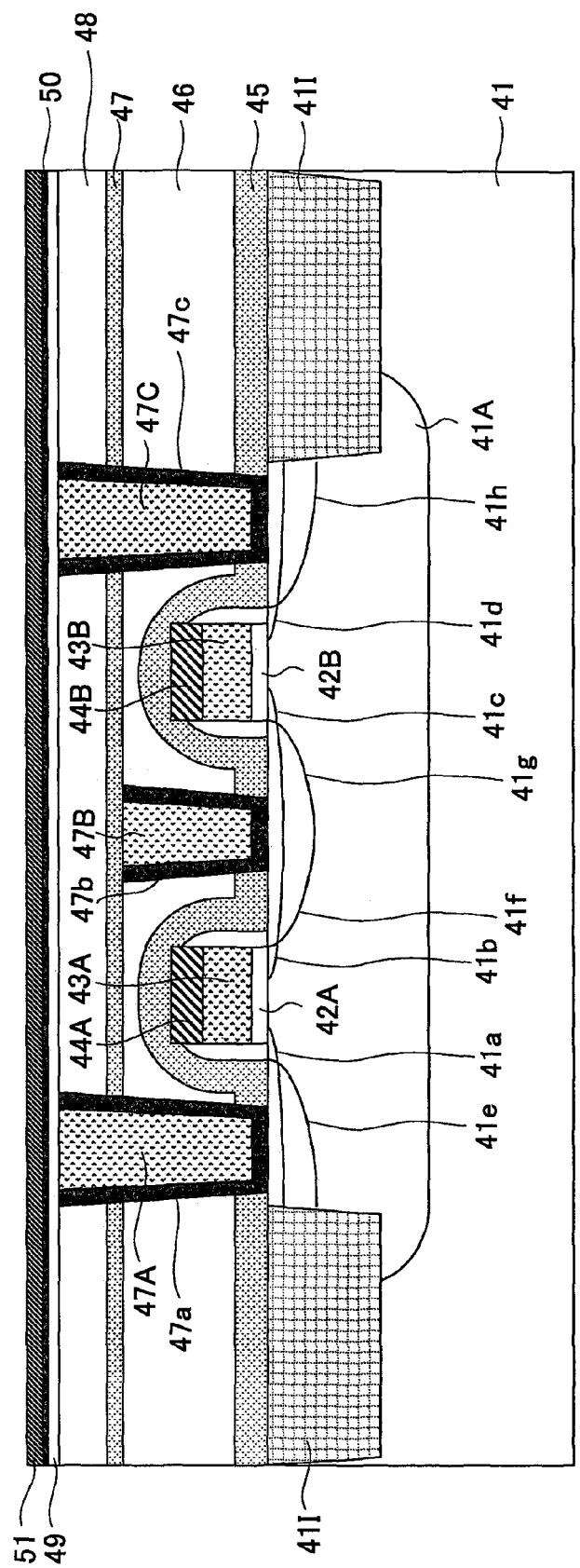

Next, in the step of FIG. 6G, a Ti film 51 is deposited on the nitride film 50 of FIG. 6F by a low temperature process such as a sputtering process with a thickness of about 20 nm such that the O—N bond between the oxide film 49 and the nitride film 50 is not cleaved.

For example, sputtering of such a Ti film 51 can be conducted in a sputtering apparatus in which the distance between the substrate to be processed and the target is set to 60 mm, under the Ar ambient of 0.15 Pa pressure at the substrate temperature of 20° C. while supplying a sputter D.C. power of 2.6 kW for 7 seconds.

Figure 11:
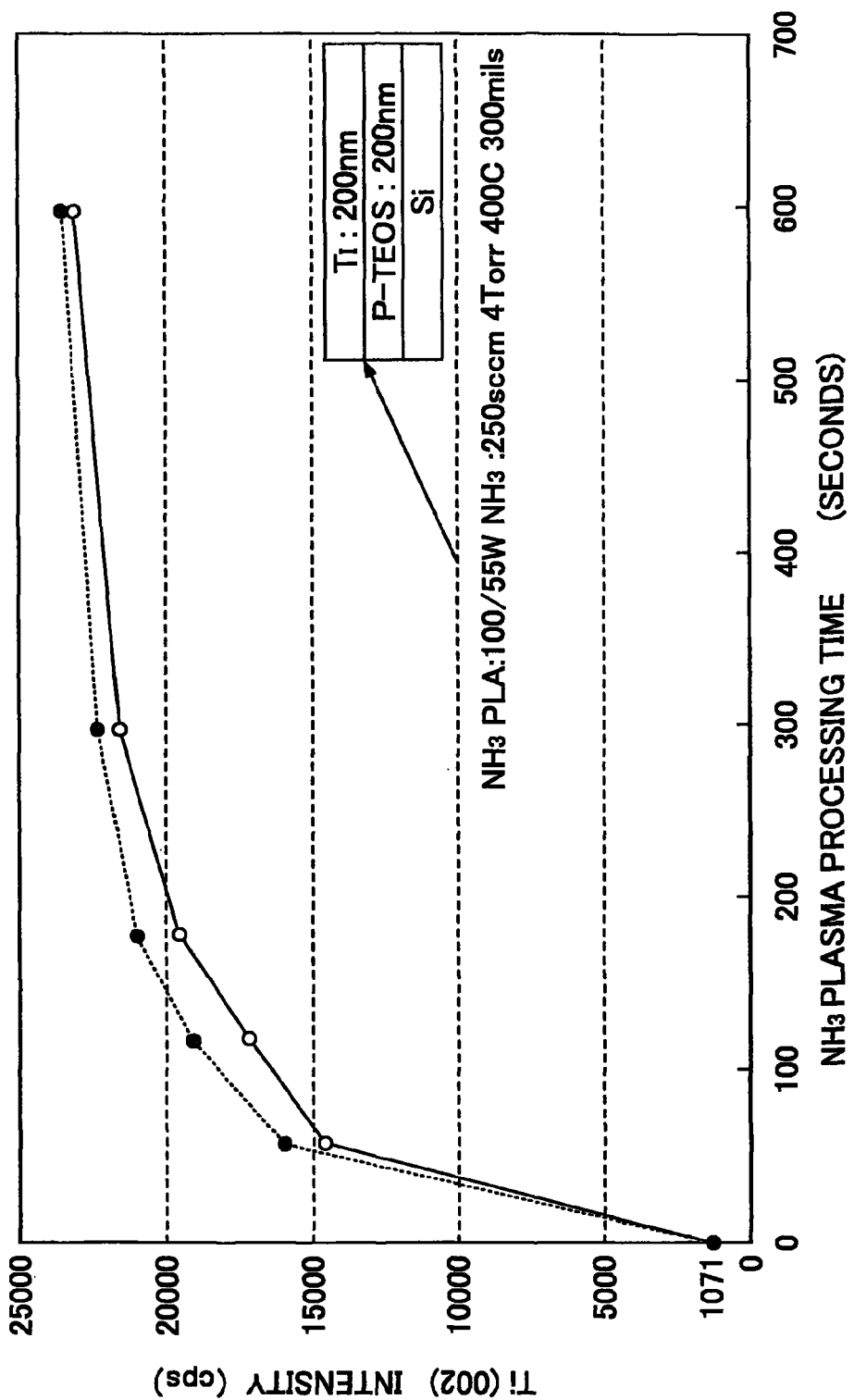
FIG. 11 is another diagram explaining the process of FIG. 6F.

FIG. 11 shows the relationship between the diffraction intensity of the Ti film formed on the silicon oxide film processed with the ammonia plasma nitridation processing explained before and the nitridation time, wherein it should be noted that the experiment of FIG. 11 was conducted by applying the plasma nitridation processing to the surface of a plasma TEOS film formed on a silicon substrate with the thickness of 500 nm under the condition of plasma nitridation explained above and further by sputtering a Ti film on the TEOS film surface thus processed with the plasma nitridation under the sputtering condition noted before.

Referring to FIG. 11, it can be seen that in the ease the ammonia plasma processing time is zero, there is observed a very weak peak for the Ti(002) diffraction, while the intensity of the Ti(002) diffraction increases with increasing time of the ammonia plasma processing, indicating that the degree of (002) orientation of the Ti film is increased.

In the ammonia plasma nitridation processing explained previously with reference to FIG. 6F, the nitridation processing has been conducted for 60 seconds, while FIG. 11 indicates that a larger degree of (002) orientation is attained for the Ti film 51 when the duration of the nitridation processing in the step of FIG. 6F is increased before forming the Ti film 51. On the other hand, the rate of increase of the degree of (002) orientation starts to decrease when the processing time has increased beyond 60 seconds.

Thus, while the Ti film formed on the nitride film 50 shows a strong (002) orientation, it is believed that this reflects the situation in that the oxide film 49 underneath is covered with the nitride film 50 and the deposited Ti atoms can move relatively freely over the surface of the nitride film without being captured by the oxygen atoms exposed at the surface of the oxide film.

In the structure of FIG. 6G, too, the Ti film 51 formed on the nitride film 50 shows a strong (002) orientation, while it should be noted that, in the present embodiment, the nitride film 50 is not only formed on the interlayer insulation film 48 but also on the conductive plugs 47A and 47C, and thus, the Ti film 51 shows the strong (002) orientation also in the part over the conductive plugs 47A and 47C. Thereby, because there is interposed the oxide film 49 between the nitride film 50 and the conductive plug 47A and between the nitride film 50 and the conductive plug 47B, the crystal orientation of the crystal grains constituting the conductive plug 47A or 47C does not cause influence on the (002) orientation of the Ti film 51.

In the step of FIG. 6G, it should be noted that the deposition of the Ti film 51 is conducted at the temperature of 300° C. or less, such as the temperature of 20° C. Thus, there occurs no decoupling of the nitrogen atoms constituting the nitride film 50 at the time of deposition of the Ti film 51.

Figure 6H:
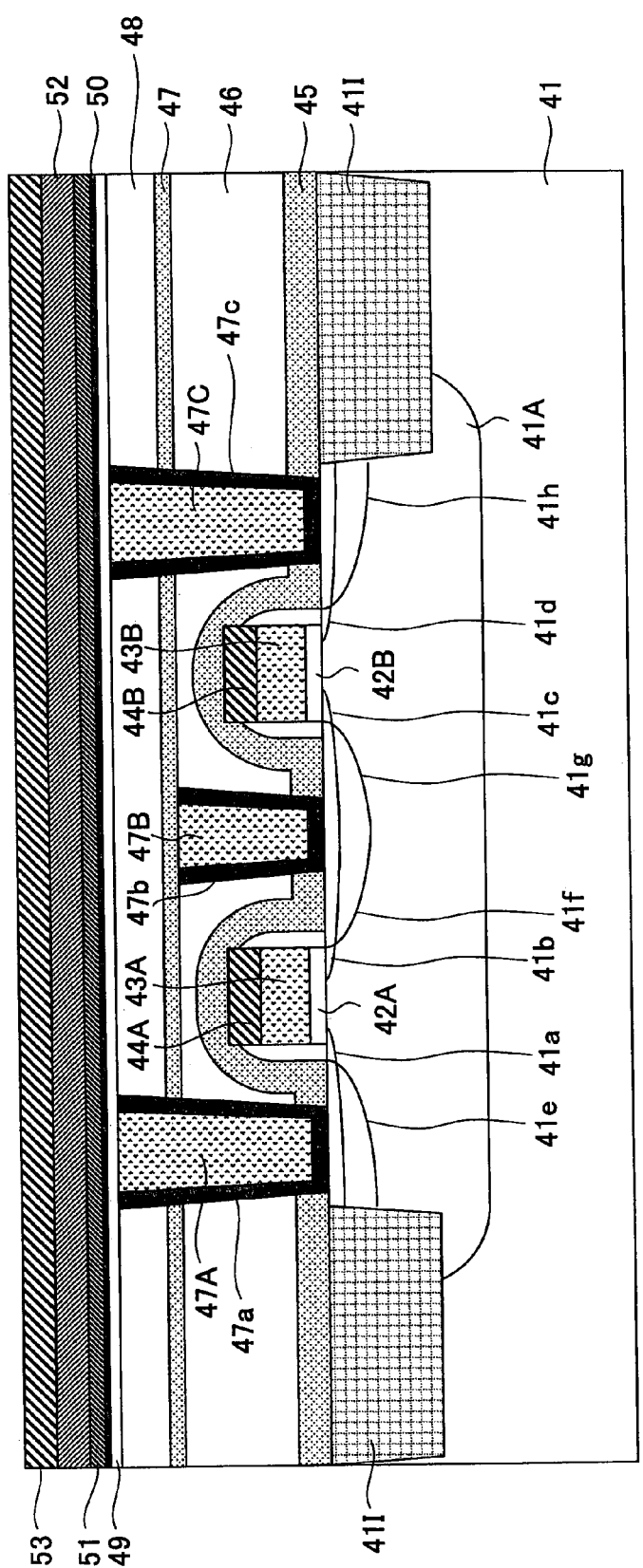

Next, in the step of FIG. 6H, a TiAlN film is formed on the structure of FIG. 6G as a first lower electrode film 52 with a thickness of 100 nm by a reactive sputtering process that uses an alloy target of Ti and Al in a mixed ambient of Ar 40 sccm and nitrogen 10 sccm under the pressure of 253.3 Pa and the substrate temperature of 400° C. while supplying a sputter power of 1.0 kW. Thereafter, an Ir film is deposited on the TiAlN film 52 as a second lower electrode film 53 with a thickness of 100 nm in an Ar ambient under the pressure of 0.11 Pa at the substrate temperature of 500° C. while supplying a sputter power of 0.5 kW.

Further, it is possible to use a conductive oxide film such as a platinum metal like Pt, or a conductive oxide such as PtO, $IrO_x$, $SrRuO_3$ in place of the Ir film 53. Further, the lower electrode film 53 may be a laminated film of the foregoing metal or metal oxide.

Figure 6I:
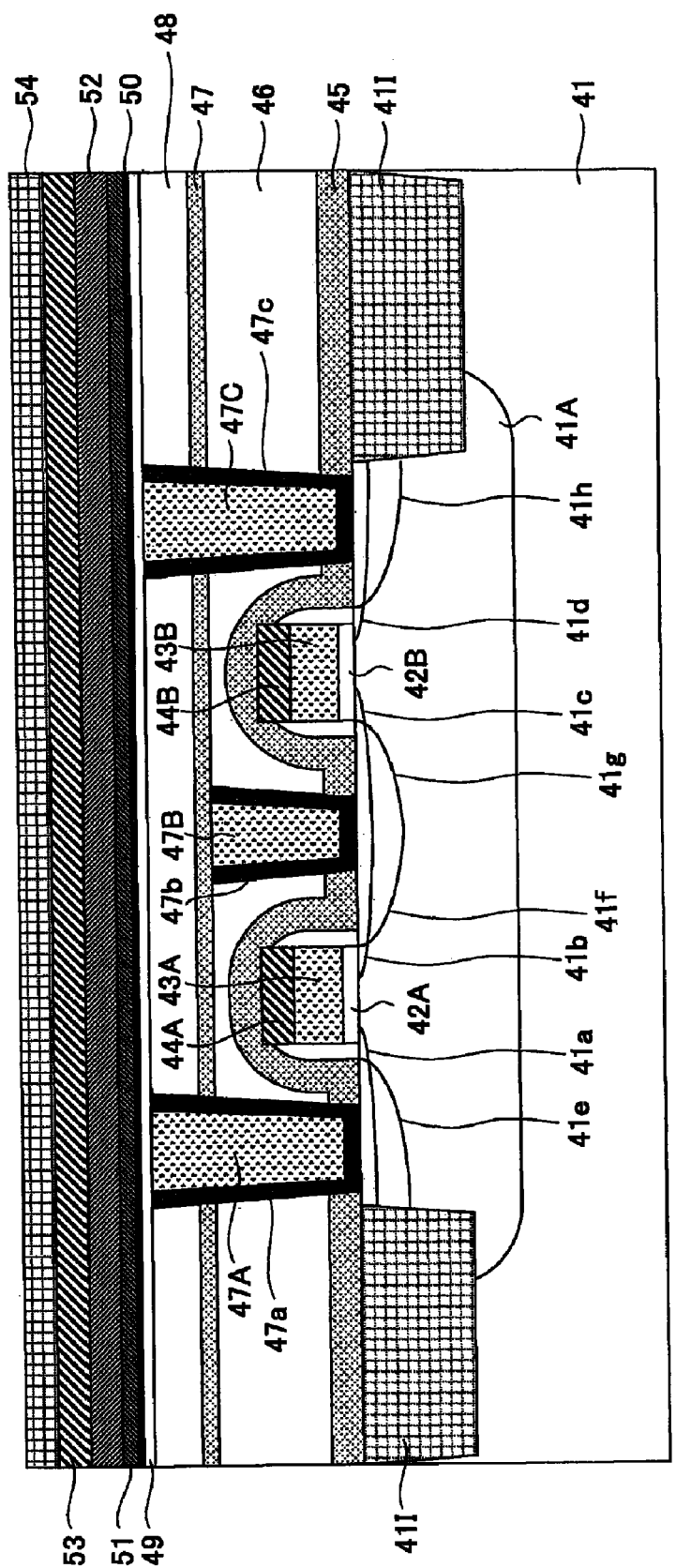

Next, in the step of FIG. 6I, a PZT film is formed on the structure of FIG. 6H as a ferroelectric film 54 by an MOCVD process.

More specifically, $Pb(DPM)_2$, $Zr(dmhd)_4$ and $Ti(O\text{-}iOr)_2$ $(DPM)_2$ are dissolved in a THF solvent with a concentration of 0.3 mol/l for each, and liquid sources of Pb, Zr and Ti are prepared. By supplying these liquid sources to the vaporizer of the MOCVD apparatus with respective flow rages of 0.326 ml/minute, 0.200 ml/minute and 0.200 ml/minute together with a THF solvent supplied with the flow rage of 0.474 ml/minute for evaporation, the source gases of Pb, Zr and Ti are formed.

Further, in the step of FIG. 6I, the structure of FIG. 6H is held in the MOCVD apparatus under the pressure of 665 Pa (5 Torr) at the substrate temperature of 620° C., and the source gases of Pb, Zr and Ti are supplied to the structure of FIG. 6H in the MOCVD apparatus for the duration of 620 seconds. With this, the desired PZT film 54 is formed on the lower electrode layer 53 with a thickness of 120 nm.

Next, in the step of Figure e6J, the structure of FIG. 6I is held at the room temperature, and an iridium oxide film 55 is sputtered thereon with a thickness of 200 nm in an Ar ambient under the pressure of 0.8 Pa by using the sputter power of 1.0 kW for 79 seconds. Further, the structure thus obtained is annealed in an oxygen ambient at the substrate temperature of 550° C. for 260 seconds such that the PZT film 54 is crystallized. Thereby, oxygen defects in the PZT film 54 are compensated. Here, it should be noted that the iridium oxide film 55 has a composition near the stoichiometric composition of $IrO_2$. Thus, there is caused no catalysis action to hydrogen, and the problem that the ferroelectric film 54 is reduced by the hydrogen radicals is successfully suppressed. Thereby, the resistance of the capacitors Q1 and Q2 against hydrogen is improved.

Figure 6J:
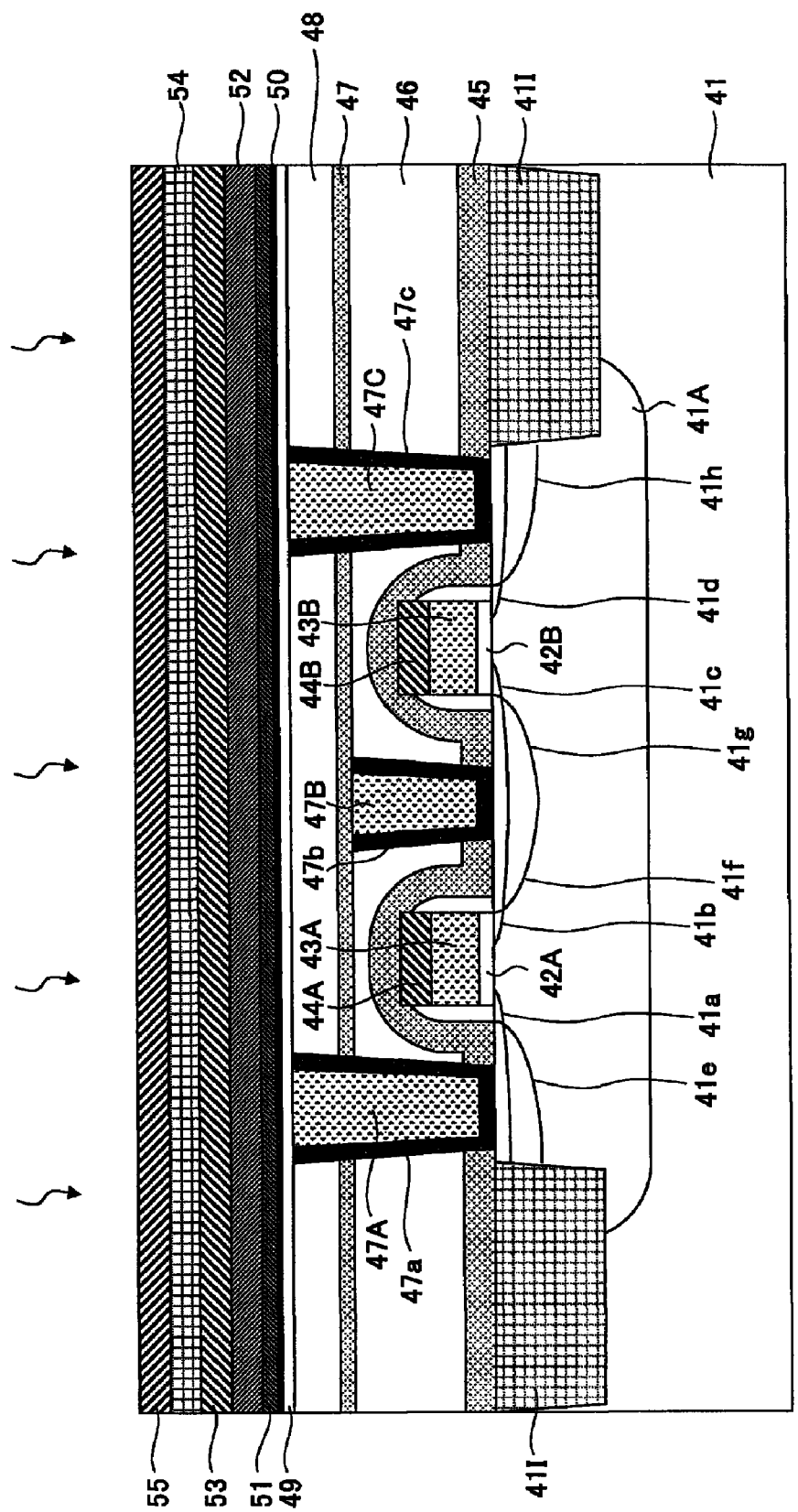
Figure 6K:
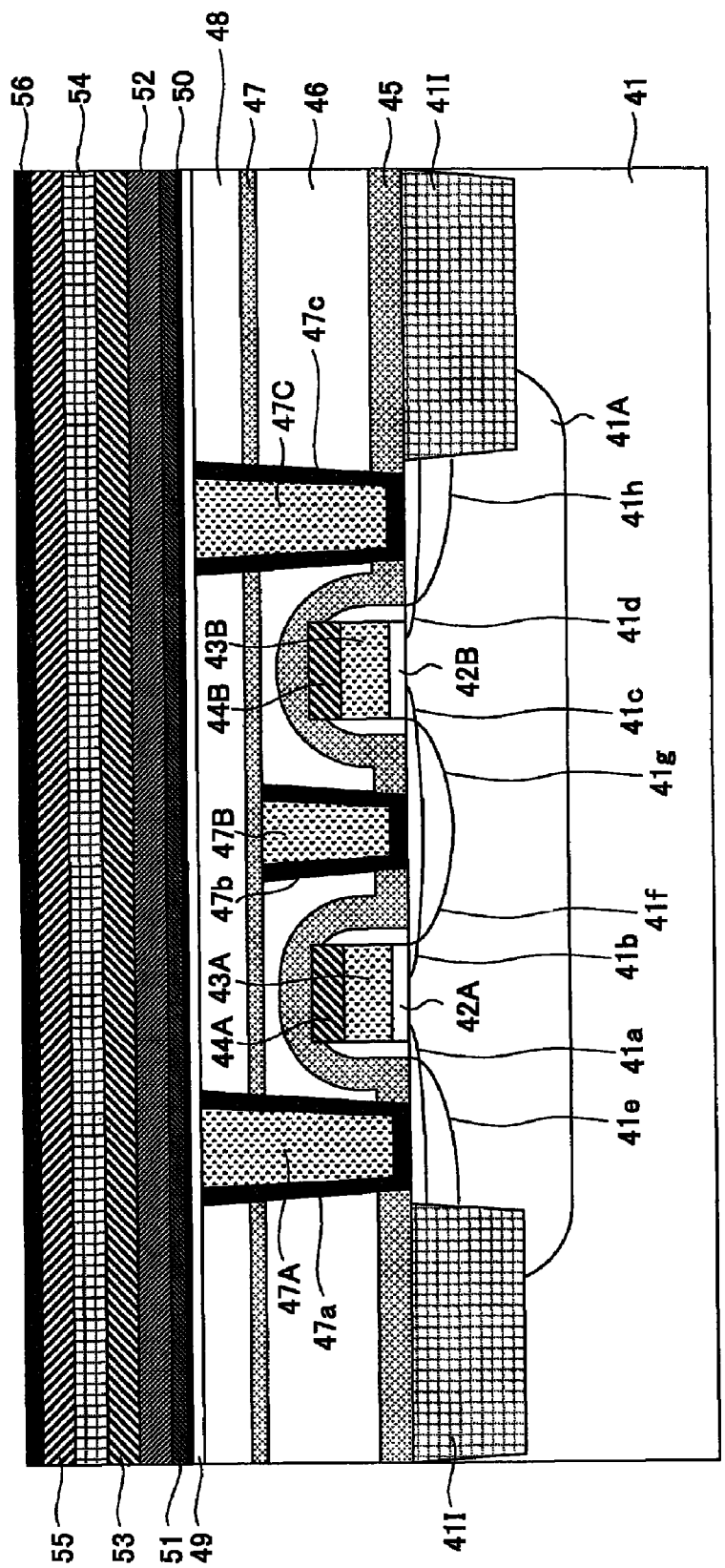

Further, in the step of FIG. 6K, an Ir film 56 is deposited on the structure of FIG. 6J with a thickness of 100 nm as a hydrogen barrier film by a sputtering process conducted in an Ar ambient under the pressure of 1 Pa while using a sputter power of 1.0 kW. Thereby, it should be noted that it is also possible to use a Pt film or $SrRuO_3$ film for the hydrogen barrier film 56.

Next, in the step of Figure e6L, the layers 49-56 are patterned, and as a result, the ferroelectric capacitor Q1 of the lamination of the layers 50A-56A and the ferroelectric capacitor Q2 of the lamination of the layers 50B-56B are obtained.

Figure 6L:
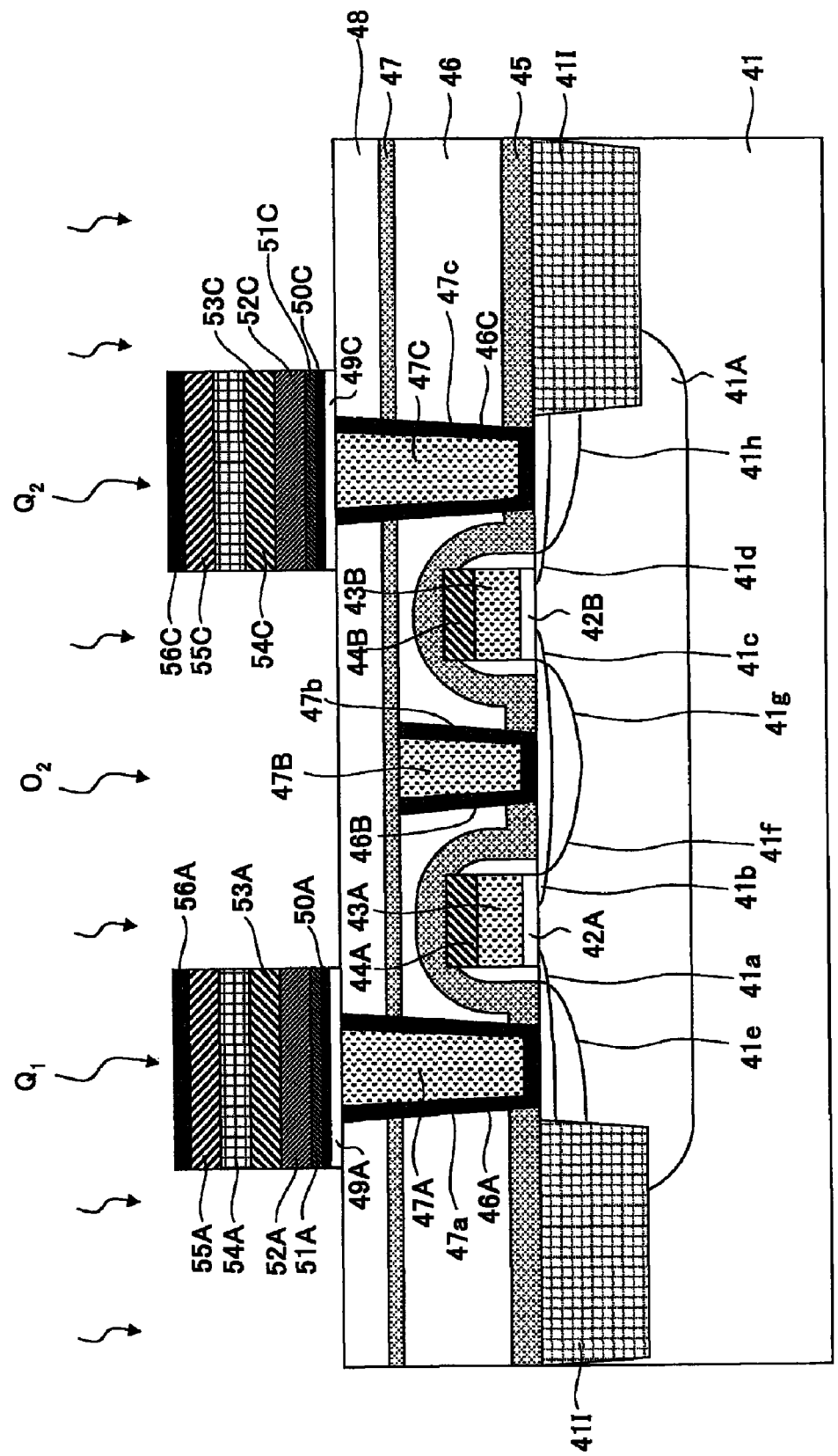
Figure 6M:
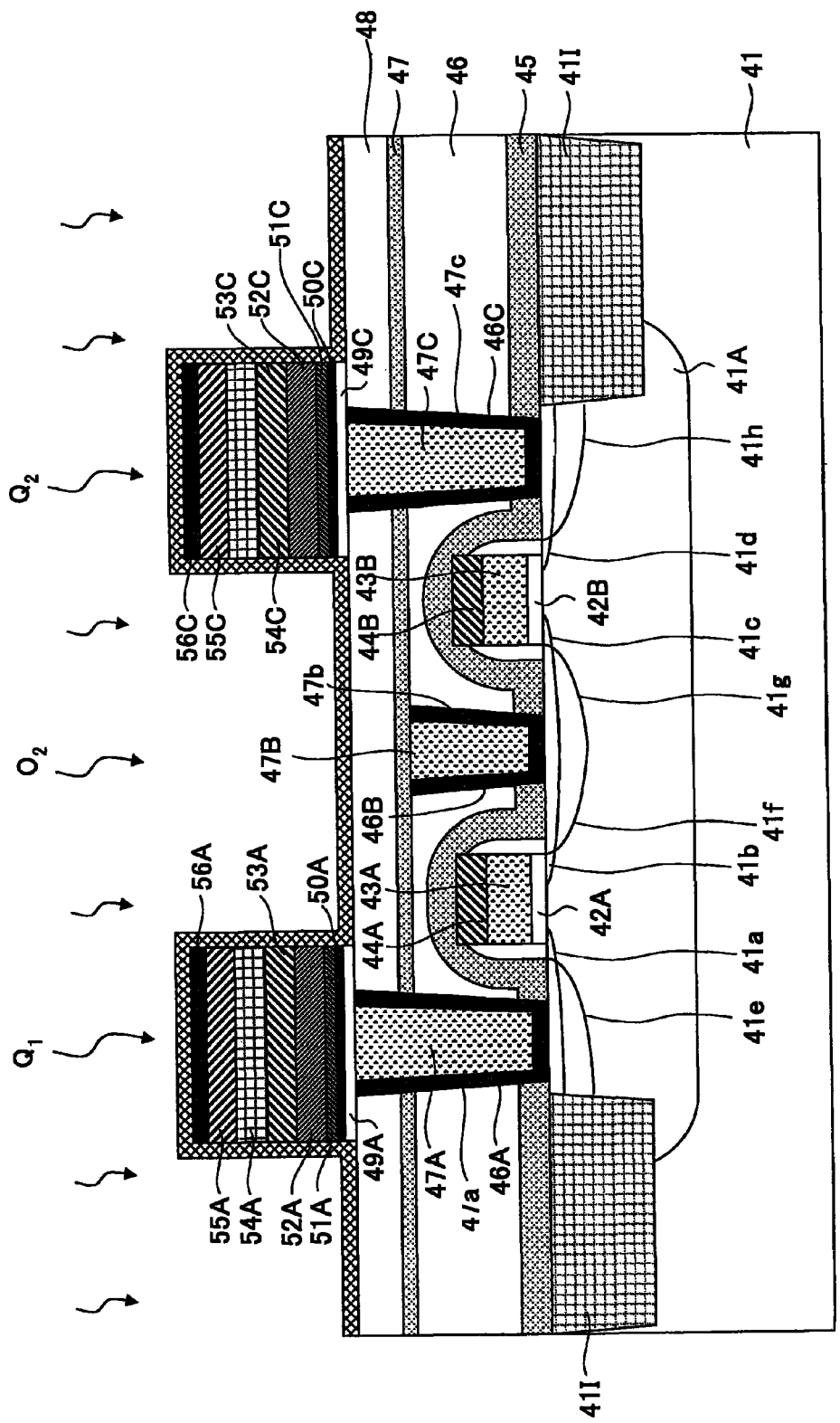

Next, in the step of FIG. 6M, an $Al_2O_3$ film is formed on the structure of FIG. 6L by a sputtering process initially with the thickness of 20 nm so as to cover the interlayer insulation film 48 and the ferroelectric capacitors Q1 and Q2, followed by a thermal annealing process conducted in an oxygen ambient of 600° C. for recovering the oxygen defects formed in the ferroelectric capacitors Q1 and Q2 as a result of the foregoing patterning process. Thereafter, the $Al_2O_3$ film 57 is formed by a CVD process with a thickness of about 20 nm.

Further, after the step of FIG. 6M, the interlayer insulation film 58 shown in FIG. 5 is deposited on the $Al_2O_3$ film 57 by a high-density plasma CVD process so as to cover the ferroelectric capacitors Q1 and Q2, and after planarization process by a CMP process, the via-plugs 59A, 59B and 59C are formed respectively in contact with the upper electrode 56A of the ferroelectric capacitor Q1, the via-plug 47B and the upper electrode 56C of the ferroelectric capacitor Q2, via respective contact holes 58A, 58B and 58C. Thereby, it should be noted that the via-plugs 59A, 59B and 59C are formed respectively with adhesion layers 59a, 59b and 59c of the Ti/TiN structure.

While not illustrated, it should be noted that the contact holes 58A-58C are formed in the interlayer insulation film 58 by first forming the contact holes 58A and 58C to expose the hydrogen barrier film 56A and 56C covering the upper electrodes of the capacitors Q1 and Q2 and apply a thermal annealing process in an oxygen ambient at the temperature of 550° C. such that any oxygen defects caused in the PZT films 54A and 54C at the time of formation of the contact holes 58A and 58C are recovered. The contact hole 58B is thus formed after the conductive plugs 59A and 59B are formed in the contact holes 58A and 58B.

When forming the conductive plugs 59A, 59B and 59C in the contact holes 58A, 58B and 58C, it is preferable to form a TiN film on the surface of the contact holes 58A, 58B and 58C as the adhesion layers 59a, 59b and 59c, such that the TiN film alone is formed for the foregoing adhesion layers. Thereby, it is also possible to form the adhesion layers 59a, 59b and 59c by forming a Ti film by a sputtering process, followed by formation of a TiN film by an MOCVD process. In this approach, it becomes possible to carry out processing in a mixed gas plasma of nitrogen and hydrogen for removing carbon from the TiN film, while in the case of the present embodiment, in which there are formed hydrogen barrier films 56A and 56C on the upper electrodes 55A and 55C, there arises no problem that the upper electrode is reduced.

Further, the interconnection patterns 60A, 60B and 60C are formed on the interlayer insulation film 58 respectively in correspondence to the via-plugs 58A, 58B and 58C.

Figure 12:
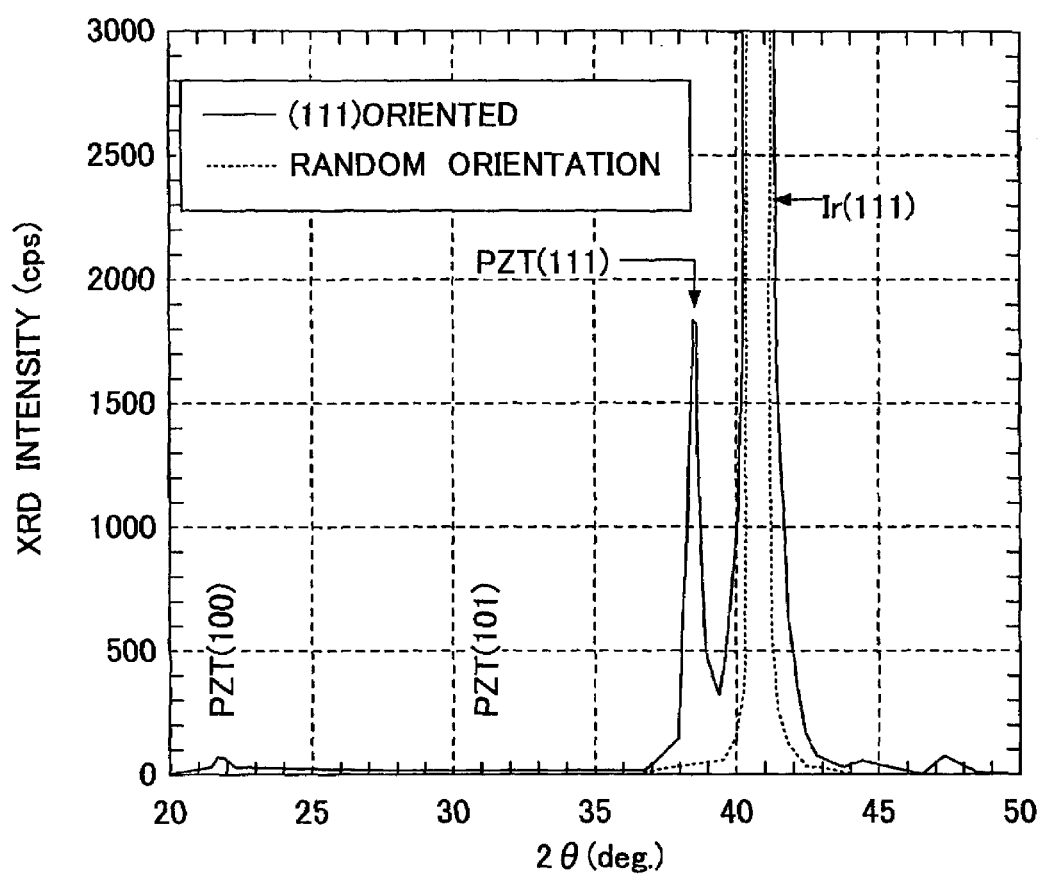
FIG. 12 is a diagram showing an X-ray diffraction pattern of the PZT film formed with the process of FIG. 6I.

FIG. 12 shows the X-ray diffraction pattern of the PZT film 54 thus formed.

Referring to FIG. 12, it becomes possible to form a PZT film of substantially (111) alignment on the interlayer insulation film 48 including those regions immediately over the conductive plugs 47A and 47B as the ferroelectric films 54A and 54C, by interposing the oxide film 49A and the nitride film 50A between the conductive plug 47A and the Ti film 51A and the oxide film 49C and the nitride film 50C between the conductive plug 47C and the Ti film 51C, wherein it will be noted from the X-ray diffraction pattern that the PZT film thus obtained shows a strong diffraction peak corresponding to the (111) surface of PZT, while little diffraction is observed from the (100) or (101) surfaces of PZT.

Figure 13:
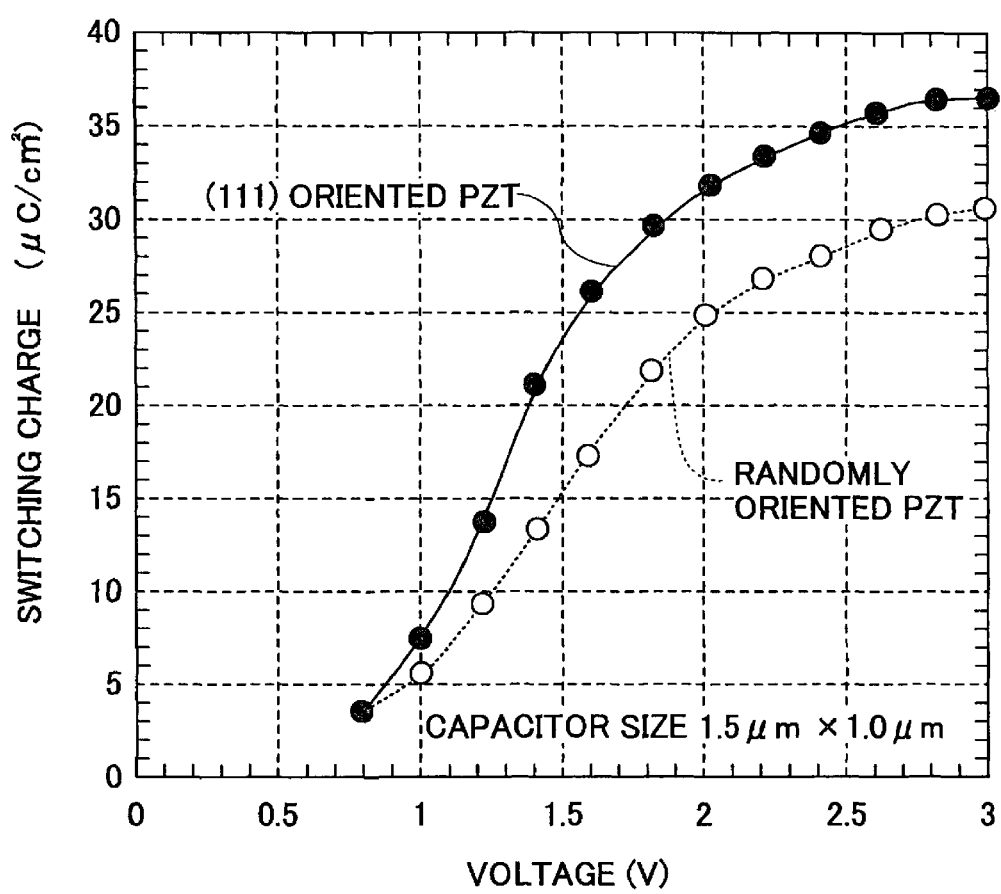
FIG. 13 is a diagram showing a switching electric charge of the ferroelectric capacitor used with the ferroelectric memory device of FIG. 5.

FIG. 13 shows the switching electric charge Qsw of the PZT film having the (111) orientation in comparison with that of the PZT film of random orientation, wherein it should be noted that the measurement of the switching electric charge Qsw is conducted by forming a ferroelectric capacitors of the size of 1.5×1.0 μm.

Referring to FIG. 13, it can be seen that the switching electric charge Qsw increases significantly when the PZT film has the (111) orientation as compared with the PZT film of the random orientation.

Figure 14:
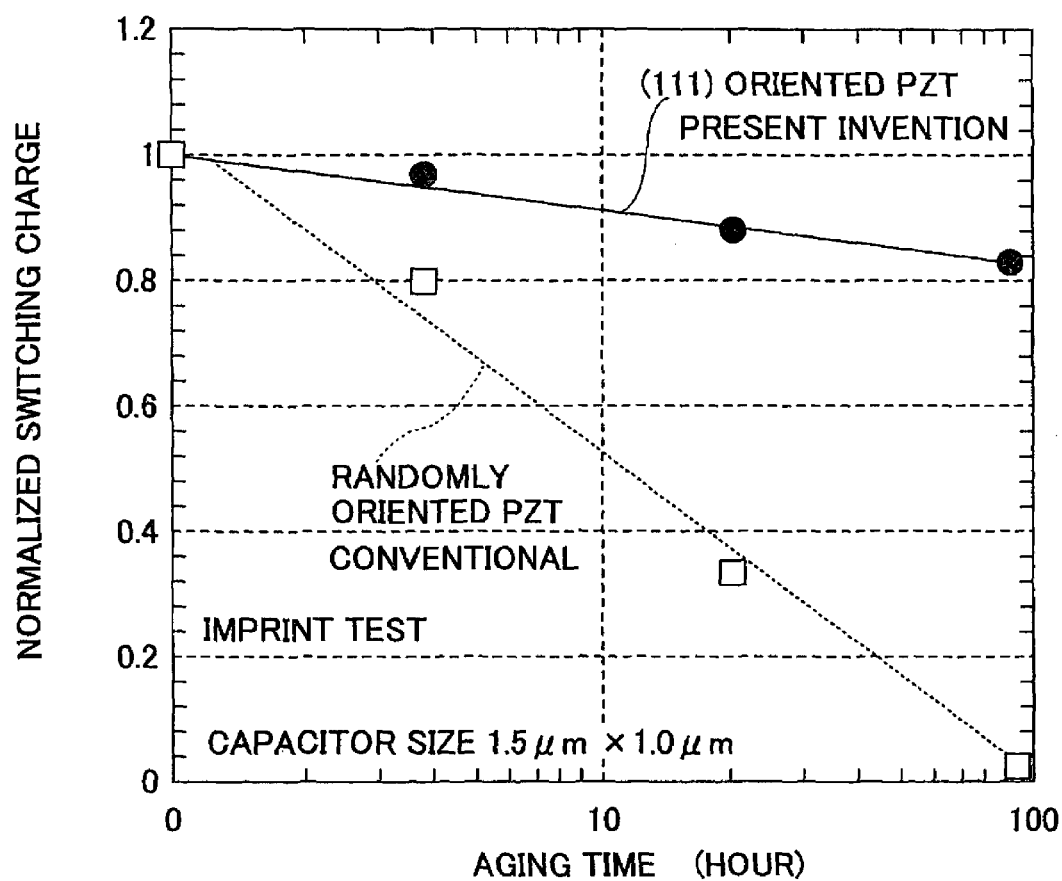
FIG. 14 is a diagram showing an imprint characteristic of the ferroelectric capacitor used with the ferroelectric memory device of FIG. 5.

FIG. 14 shows the imprinting characteristics of the PZT film thus having the (111) orientation in comparison with that of the PZT film of random orientation, wherein it should be noted that the measurement of the imprinting characteristics is conducted also by forming the ferroelectric capacitors of the size of 1.5×1.0 μm.

Referring to FIG. 14, it can be seen that the switching electric charge Qsw of the PZT film of the (111) orientation does not show degradation of more than 20% even after duration of 100 hours has elapsed, while in the PZT film of the random orientation, it can be seen that the switching eclectic charge decreases steeply with time.

As noted before, the present invention achieves such improvement of electric characteristics by interposing the nitride film 50 in the step of FIG. 6F underneath the self-aligned Ti film 51 having the (002) orientation such that the Ti atoms in the Ti film 51 does not develop a firm bond with the oxygen atoms in the oxide film 49.

Figure 15:
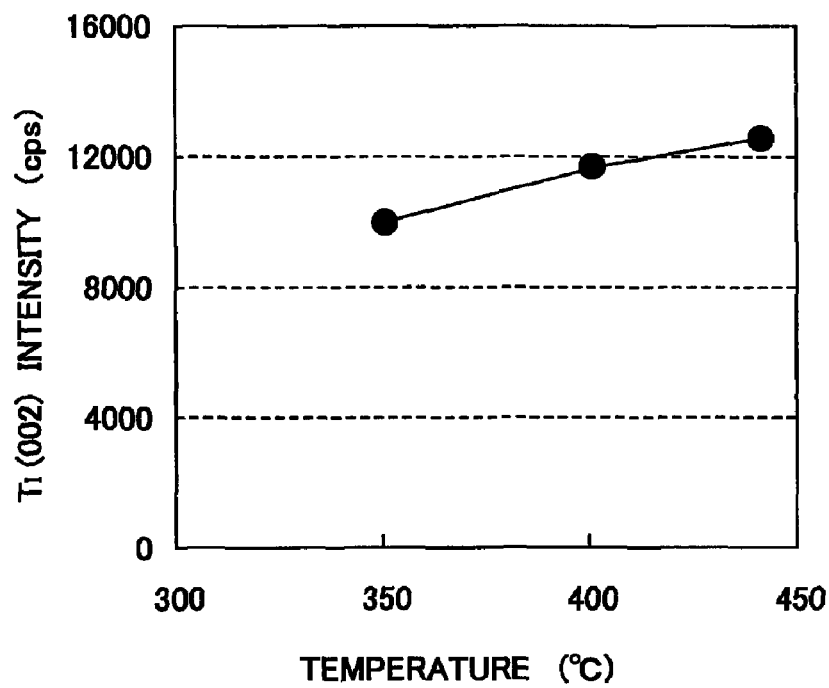
FIG. 15 is a diagram showing the processing condition of the process step of FIG. 6F.

Thereby, while the nitridation processing has been conducted in the step of FIG. 6F at the substrate temperature of 600° C., the present invention is not limited to such a specific temperature, and it will be noted that the nitridation processing can be conducted at the temperature of 350-450° C. as shown in FIG. 15.

Figure 16:
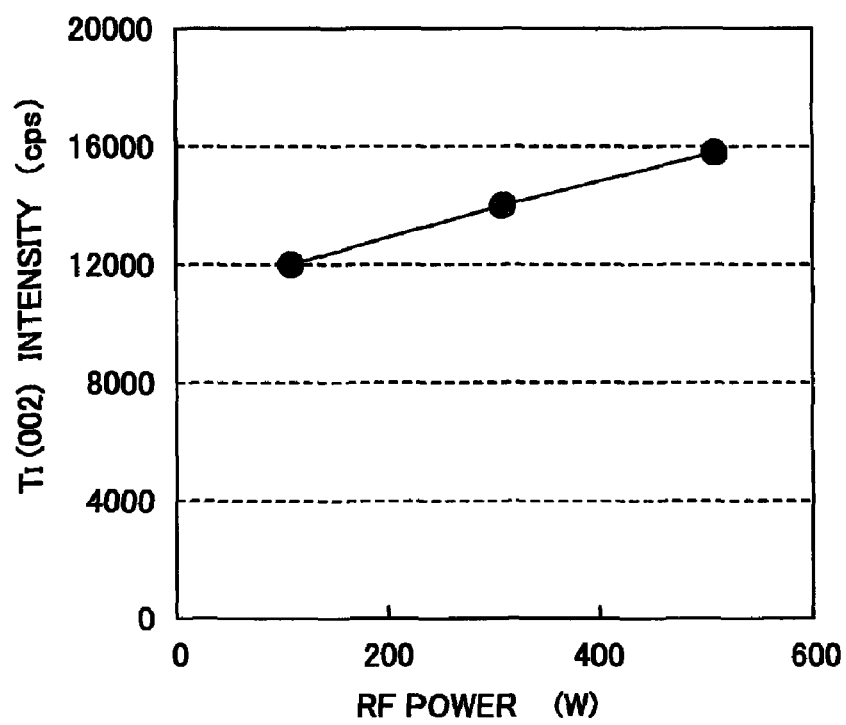
FIG. 16 is another diagram showing the processing condition of the process step of FIG. 6F.

Further, it is possible to change the plasma power at the time of the nitridation processing in the range of 100-500 W as shown in FIG. 16.

Second Embodiment

Figure 17:
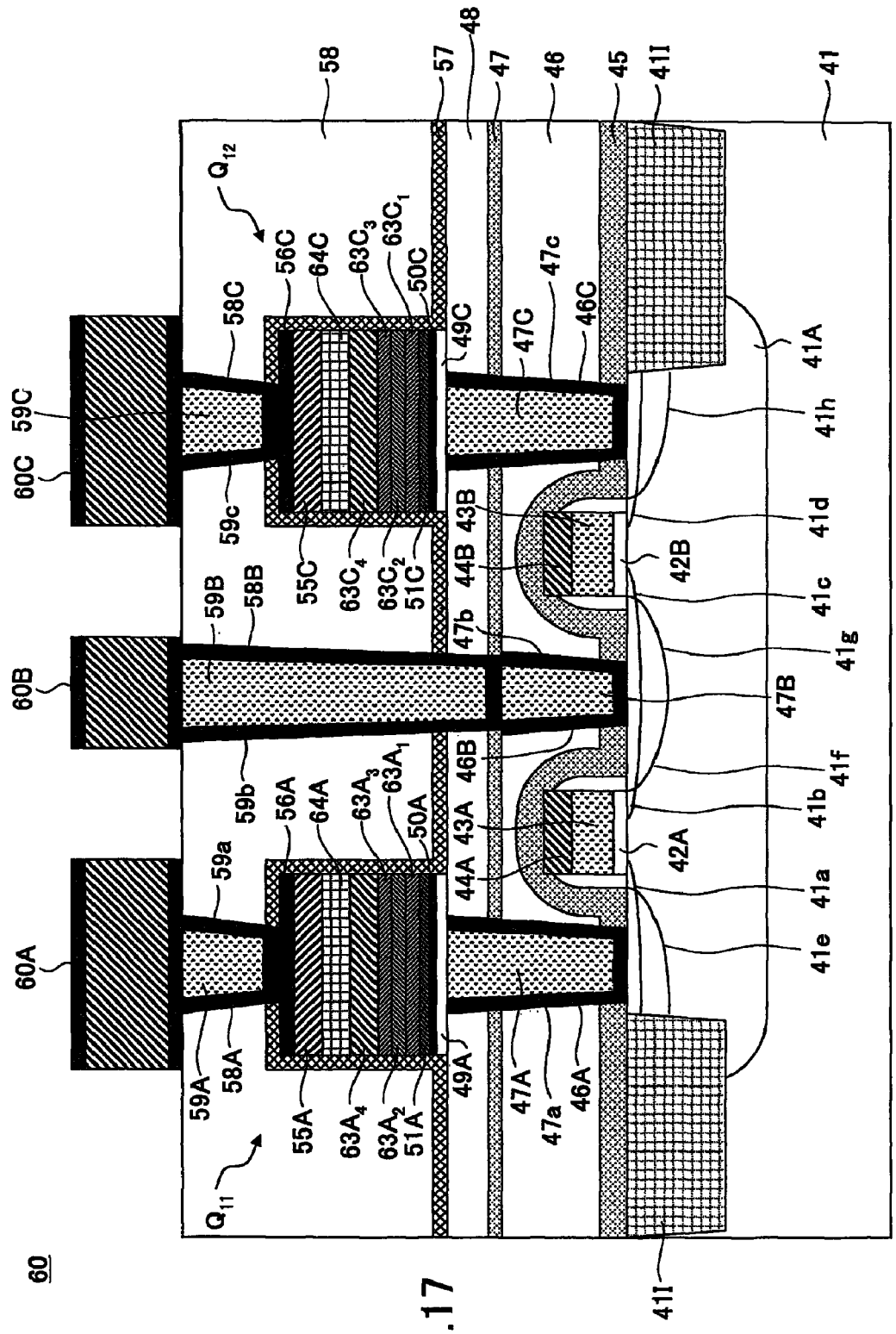
FIG. 17 is a diagram showing the construction of a ferroelectric memory device according to a second embodiment of the present invention.

FIG. 17 shows the construction of a ferroelectric memory device 60 according to a second embodiment of the present invention, wherein those parts of FIG. 17 corresponding to those parts explained previously are designated with the same reference numerals and the description thereof will be omitted.

Referring to FIG. 17, the ferroelectric memory device 60 has a construction similar to the ferroelectric memory device 40 explained with reference to FIG. 5, except that there are formed ferroelectric capacitors Q11 and Q12 that use PZT films 64A and 64C formed by a sputtering process.

With this, the lower electrode is formed in the ferroelectric capacitor Q11 by lamination of an Ir film 62A1 having the thickness of 100 nm, an IrOx film 62A2 having the thickness of 20 nm, a PtOx film 62A3 having the thickness of 20 nm and a Pt film 62A4 having the thickness of 100 nm.

Similarly, the lower electrode is formed in the ferroelectric capacitor Q12 by lamination of an Ir film 62C1 having the thickness of 100 nm, an IrOx film 62C2 having the thickness of 20 nm, a PtOx film 62C3 having the thickness of 20 nm and a Pt film 62C4 having the thickness of 100 nm.

Thereby, the films 62A1-62A4 and the films 62C1-62C4 are formed by a sputtering process, wherein the sputtering process of the PZT films 64A and 64B is formed by using a PZT target in which the Pb/(Zr+Ti) ratio is set to 1.03 and containing Ca and La respectively with the concentration of 1-2% and 1-2%, in an Ar ambient of 1 Pa pressure while supplying a plasma power.

The ferroelectric capacitors Q11 and Q12 thus formed are repeatedly annealed in an oxidizing ambient similarly to the previous embodiment for compensation of the oxygen defects.

In the present embodiment, too, there are formed oxide films 49A and 49C on the surfaces of the conductive plugs 47A and 47C, and the nitride films 50A and 50C are formed further thereon. Thus, the crystal orientation of the conductive plugs 47A and 47C does not affect the orientation of the Ti self-aligned films 51A and 51C, and the Ti films 51A and 51C shows an ideal (002) orientation.

With this, the Ir film, the Pt film and the PZT film formed thereon exhibit a strong (111) orientation.

Figure 18:
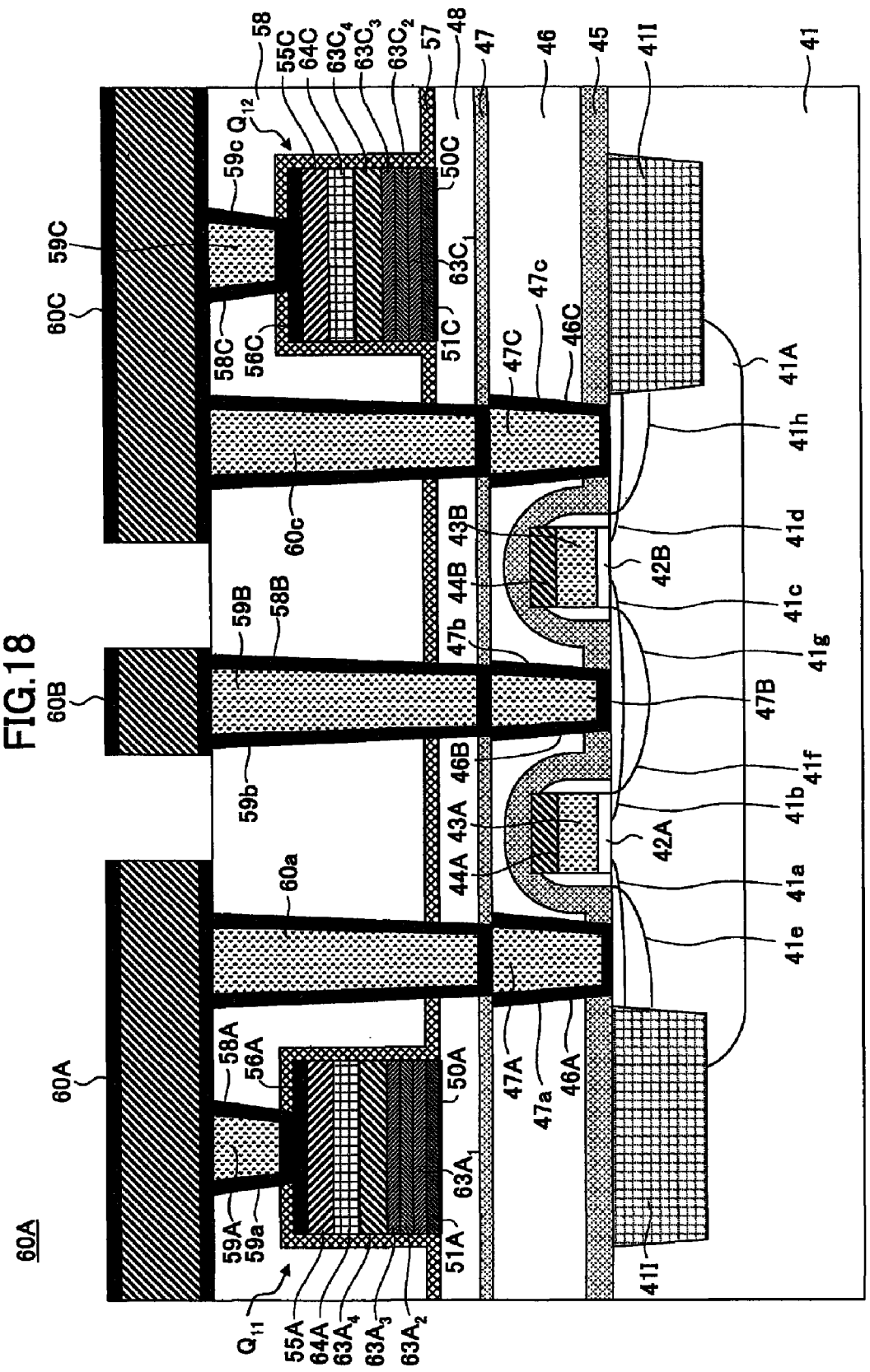
FIG. 18 is a diagram showing a modification of the ferroelectric memory device of FIG. 17.

Further, it is possible to modify the construction of the ferroelectric capacitor 60 of FIG. 17 as shown in FIG. 18, in which the ferroelectric capacitors Q11 and Q12 are disposed offset from the regions immediately over the conductive plugs 47A and 47B.

In this case, the upper electrode 55A of the ferroelectric capacitor Q11 is connected electrically to the diffusion region 41e of the memory cell transistor by way of the interconnection pattern 60A on the interlayer insulation film 58, the conduct plug 47A, and an intervening constant plug 60a.

Similarly, the upper electrode 55C of the ferroelectric capacitor Q12 is connected electrically to the diffusion region 41h of the memory cell transistor by way of the interconnection pattern 60C on the interlayer insulation film 58, the conduct plug 47C, and an intervening constant plug 60c.

With such a construction, there exists no conductive plug in the region right underneath the ferroelectric capacitors, and thus, the insulation films 49A and 49C are not necessary. Thus, by forming the Ti film on the nitride films With this, it becomes possible to control the PZT films 64A and 64C to have the (111) orientation also in the ferroelectric memory device 60A of Figure e18.

While explanation has been made in the preceding embodiments that the self alignment films 51A and 51C are formed of a Ti film, it is also possible to use other self-orientation films such as an Ir film, a Pt film, a PZT film, a SrRuO$_3$ film, a Ru film, a TiN film, a TiAlN film, a Cu film, an IrOx film, and the like.

Further, while explanation has been made in the preceding embodiments that the conductive plugs, 47A-47C and 59A-59C are W plugs, it is also possible to use polysilicon, Ti, TiN, TiAlN, Al, Cu, Ru, SrRuO$_3$, and the like, for the foregoing conductive plugs.

Further, while explanation has been made in each the preceding embodiments that the ferroelectric films 54A and 54C are formed of a PZT film, it is also possible to use the films of other PZT solid solution compositions such as a PLZT film. Further, it is also possible to use other perovskite films such as BaTiO$_3$, (Bi$_{1/2}$Na$_{1/2}$)TiO$_3$, KNbO$_3$, NaNbO$_3$, LiNbO$_3$, and the like, for the ferroelectric films 54A and 54C.

Furthermore, the present invention is useful also for the production of the semiconductor devices having a functional film that utilizes crystal orientation, in addition to the ferroelectric memory device.

Further, while the present invention has been explained heretofore with regard to preferred embodiments, the present invention is by no means limited to particular embodiments but various variations and modifications may be made without departing from the scope of the invention.

What is claimed is:

1. A method of fabricating a ferroelectric memory apparatus, comprising:
   forming an interlayer insulation film so as to cover a transistor which is formed on a semiconductor substrate;
   forming a conductive plug in said interlayer insulation film in contact with a diffusion region of said transistor; and
   forming a ferroelectric capacitor over said conductive plug by consecutively stacking a lower electrode, a ferroelectric film and an upper electrode,
   wherein there is provided, after said process of forming said conductive plug but before said process of forming said lower electrode, the process of: forming a layer containing oxygen on said interlayer insulation film and a surface of said conductive plug; forming a layer containing nitrogen on a surface of said layer containing oxygen including a part of said layer containing oxygen on said conductive plug; and forming a self-alignment film on said layer containing nitrogen,
   said process of forming said layer containing oxygen comprises the process of depositing a layer containing Si on said surface of said contact plug; and reacting oxygen radicals to said layer containing Si.

2. The method as claimed in claim 1, wherein said process of forming said layer containing oxygen comprises the process of: supplying a Si compound into a processing space containing said interlayer insulation film and said surface of said contact plug, such that said Si compound is adsorbed to said surface; removing said Si compound remaining in said processing space; supplying an oxidizing agent to said processing space and reacting oxygen atoms with said Si compound adsorbed to said surface; and removing said oxidizing agent remaining in said processing space.

3. The method of fabricating a ferroelectric memory device as claimed in claim 1, wherein said process of forming said layer containing oxygen comprises the process of reacting oxygen radicals to said surface of said contact plug.

4. The method as claimed in claim 1, wherein said process of forming said layer containing nitrogen comprises the process of reacting NH radicals to a surface of said layer containing oxygen.

5. The method as claimed in claim 1, wherein said process of forming said layer containing nitrogen comprises the process of reacting nitrogen radicals and hydrogen radicals to a surface of said layer containing oxygen.

6. The method as claimed in claim 1, wherein said process of forming said self-alignment film is conducted at a temperature of 300° C. or less.

7. The method as claimed in claim 1, wherein said process of forming said self-alignment film comprises the process of depositing a Ti film.

8. A method of fabricating a semiconductor device having a functional film, comprising:
   forming an interlayer insulation film so as to cover a transistor which is formed on a semiconductor substrate;
   forming a conductive plug in said interlayer insulation film in contact with a diffusion region of said transistor; and
   forming a functional film over said conductive plug,
   wherein there is provided, after said process of forming said conductive plug but before process step of forming said functional film, the process of: forming a layer containing oxygen on said interlayer insulation film and a surface of said conductive plug; forming a layer containing nitrogen on a surface of said layer containing oxygen including a part of said layer containing oxygen on said conductive plug; and forming a self-alignment film on said layer containing nitrogen,
   said process of forming said layer containing oxygen comprises the process of depositing a layer containing Si on said surface of said contact plug; and reacting oxygen radicals to said layer containing Si.

9. The method as claimed in claim 8, wherein said functional film comprises a Ti film.

10. The method as claimed in claim 9, wherein said Ti film has a (002) orientation.

11. The method as claimed in claim 8, wherein said functional film consists of one of an Ir film, a Pt film, a PZT film, a SrRuO3 film, a Ru film, a TiN film, a TiAlN film, a Cu film and IrOx film.

* * * * *